US007072777B1

(12) United States Patent
Wakui et al.

(10) Patent No.: US 7,072,777 B1
(45) Date of Patent: Jul. 4, 2006

(54) EXPOSURE APPARATUS ANTI-VIBRATION APPARATUS, SYSTEM IDENTIFICATION APPARATUS AND SYSTEM IDENTIFICATION METHOD

(75) Inventors: Shinji Wakui, Utsunomiya (JP); Takehiko Mayama, Utsunomiya (JP); Shuichi Adachi, Utsunomiya (JP); Hiroaki Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/333,522

(22) Filed: Jun. 15, 1999

(30) Foreign Application Priority Data

Jun. 23, 1998 (JP) ............................... 10-190968
Jun. 11, 1999 (JP) ............................... 11-165369

(51) Int. Cl.
*G01F 17/00* (2006.01)

(52) U.S. Cl. .................... 702/56; 702/79; 702/109; 702/110; 702/111

(58) Field of Classification Search ................ 702/79, 702/56, 109, 110, 111; 188/378
See application file for complete search history.

(56) References Cited

U.S. PATENT DOCUMENTS

| 3,742,391 | A | * | 6/1973 | Smith ........................ 333/100 |
| 4,654,808 | A | * | 3/1987 | Potter et al. ................ 702/111 |
| 5,568,032 | A | | 10/1996 | Wakui ........................ 318/632 |
| 5,572,440 | A | * | 11/1996 | Harashima et al. ......... 700/280 |
| 5,653,317 | A | | 8/1997 | Wakui ........................ 188/378 |
| 6,128,552 | A | * | 10/2000 | Iwai et al. .................. 700/280 |

OTHER PUBLICATIONS

Horowitz and Hill, "The Art of Electronics", Cambridge University Press, 1989, pp. 655-660.*
Adachi, et al., "A Comparative Study of Prediction Error Method and Subspac Method Using ETS-VI On-Orbit System Indentification Experimental Data", Transactions Institute of Measurement Automatic Control, vol. 33, No. 8, pp. 805-811 (1997).

* cited by examiner

*Primary Examiner*—Michael Nghiem
*Assistant Examiner*—Stephen J. Cherry
(74) *Attorney, Agent, or Firm*—Fitzpatrick, Cella, Harper & Scinto

(57) ABSTRACT

An exposure apparatus includes a motion control system, the motion control system including a structure, a plurality of actuators to apply forces to the structure, respectively, and a plurality of sensors to sense motion states of the structure, respectively. The apparatus includes a pseudo-random signal generator to generate a plurality of pseudo-random signals and to apply the plurality of pseudo-random signals to the plurality of actuators, the plurality of pseudo-random signals being equal in number to a number of degrees of freedom of the motion control system, a storage unit to store a first plurality of time-series data obtained by the plurality of sensors with a second plurality of time-series data corresponding to the plurality of pseudo-random signals, and a characteristic deriving unit to derive a characteristic of the motion control system based on the first and second plurality of time-series data.

10 Claims, 25 Drawing Sheets

EXAMPLE OF OUTPUT
WAVEFORM OF M-SEQUENCE

EXAMPLE OF RESPONSE WAVEFORM
WITH RESPECT TO VIBRATING
OPERATION USING M-SEQUENCE

DISTURBANCE SUPPRESSION RATIO OF STAGE OBTAINED UPON VIBRATING OPERATION OF ACTIVE ANTI-VIBRATION APPARATUS

FREQUENCY RESPONSE
(INERTANCE) MEASURED
BY VIBRATING OPERATION
USING M-SEQUENCE

FIG. 20
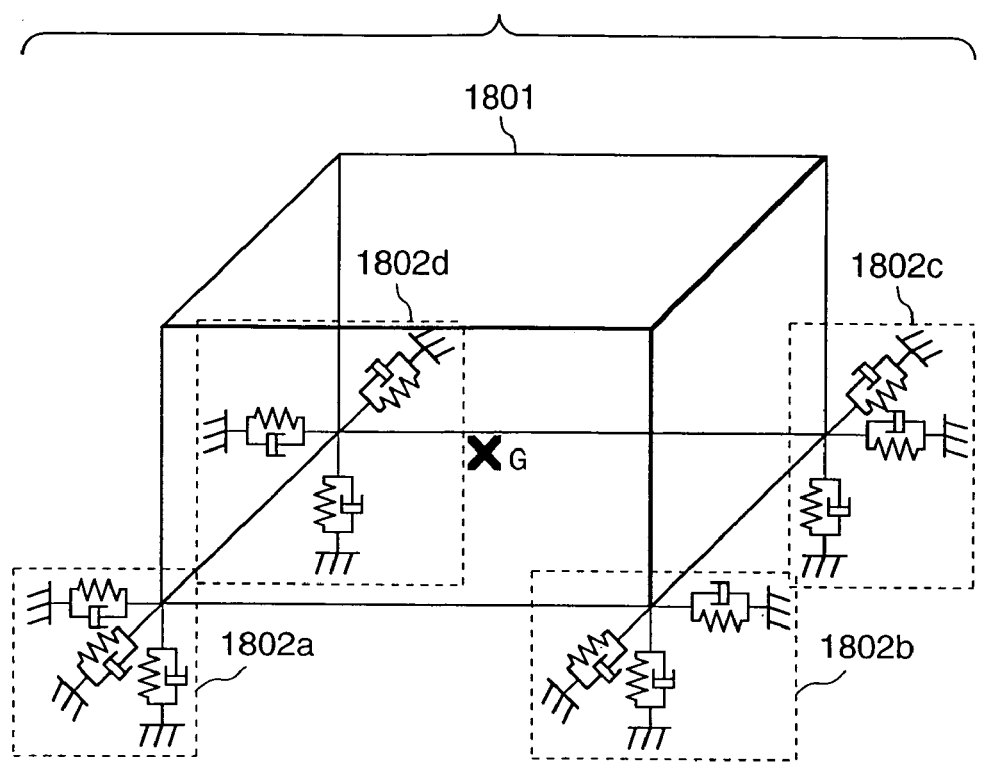
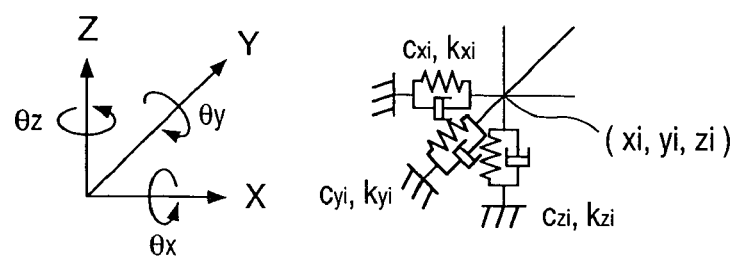

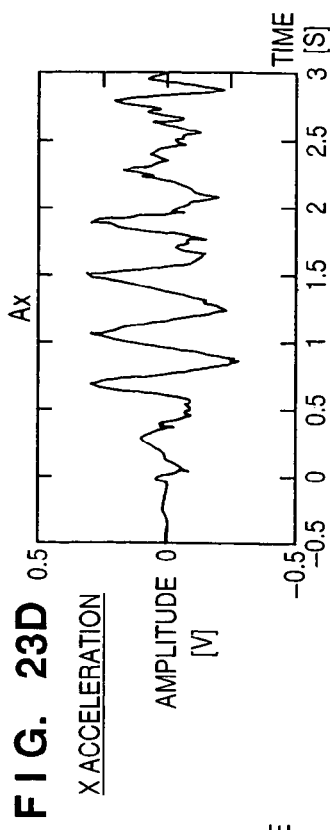
FIG. 23A X THRUST FORCE COMMAND
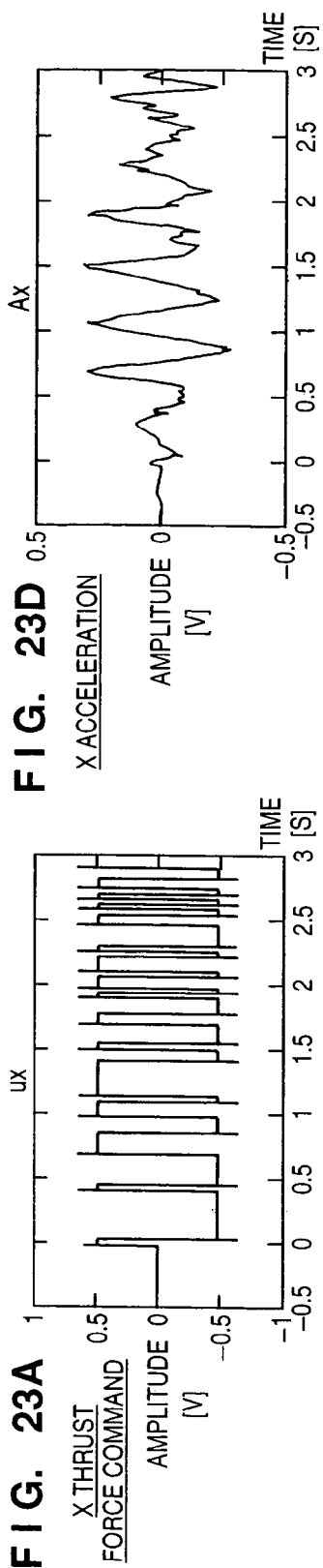
FIG. 23B Y THRUST FORCE COMMAND
FIG. 23C θz MOMENT COMMAND
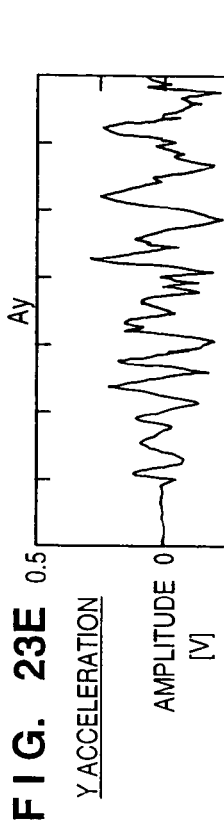
FIG. 23D X ACCELERATION
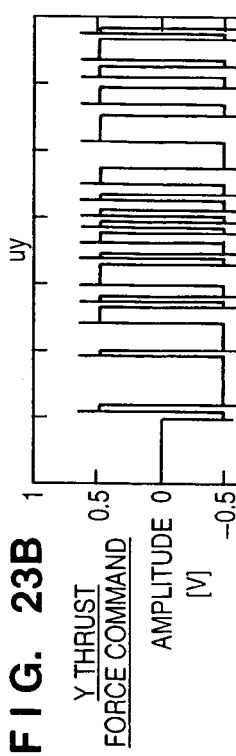
FIG. 23E Y ACCELERATION
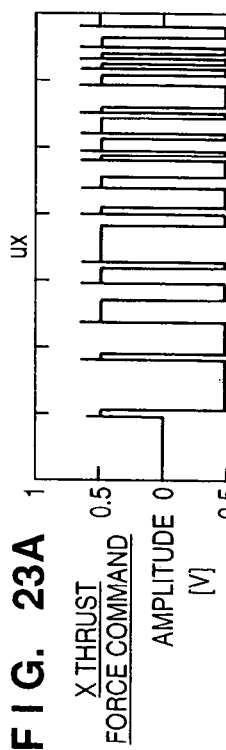
FIG. 23F θz ACCELERATION
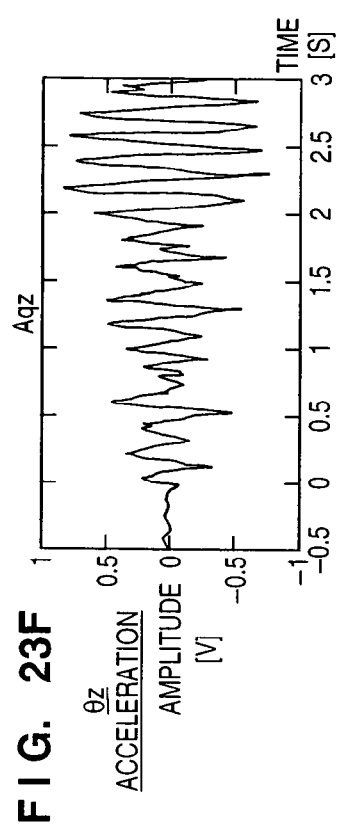
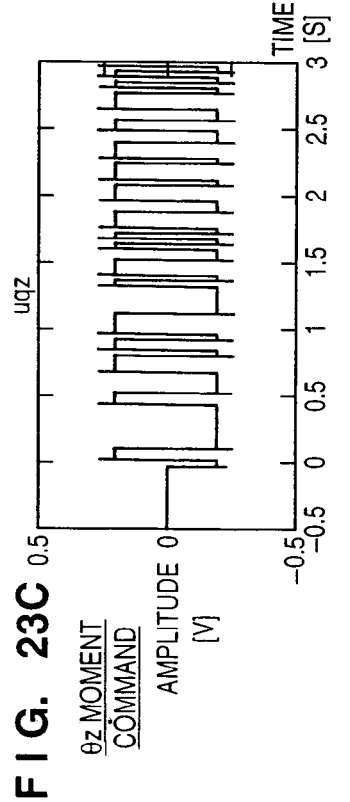

FIG. 24
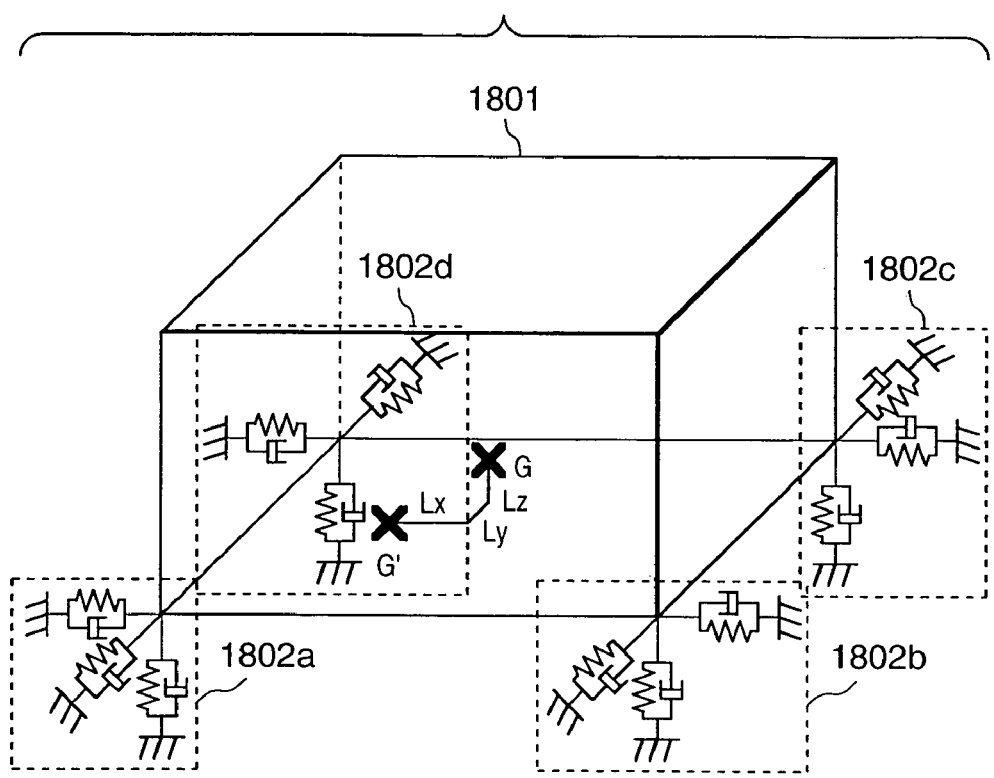
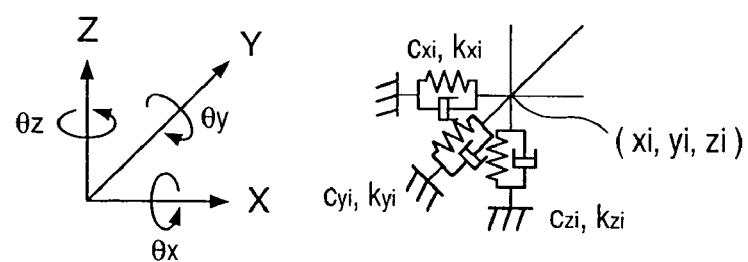

EXPOSURE APPARATUS ANTI-VIBRATION APPARATUS, SYSTEM IDENTIFICATION APPARATUS AND SYSTEM IDENTIFICATION METHOD

BACKGROUND OF THE INVENTION

1. Field of the Invention

The present invention relates to a method of identifying the dynamic characteristics of a motion mechanism such as an X-Y stage or active anti-vibration apparatus in a semiconductor exposure apparatus in a short period of time with a high precision in the design, manufacturing, and evaluation stages, an exposure apparatus incorporating the method as hardware or software, a system identification apparatus for identifying changes in the characteristics of these apparatuses, a system identification method, and a method of manufacturing devices by using the exposure apparatus.

2. Description of the Related Art

A semiconductor manufacturing apparatus typified by an electron microscope using electron beams, a stepper, a scanner, or the like, incorporates various motion mechanisms such as an X-Y stage, a fine adjustment stage mounted on the X-Y stage, and an anti-vibration apparatus for isolating these stages from floor vibrations. To ensure and to guarantee the performance of the semiconductor manufacturing apparatus, feedback control for the maximum performance of these motion mechanisms must be implemented. In addition, this apparatus must incorporate a control scheme based on a consideration of the relationship in performance between the motion mechanisms, as well as the performance of each motion mechanism as a signal unit.

To produce the maximum positioning performance of the X-Y stage, the anti-vibration and damping characteristics as the performance index of the anti-vibration apparatus must be fully exploited. If such characteristics cannot be fully exploited, and disturbances such as floor vibrations cannot be sufficiently removed, the positioning performance of the X-Y stage cannot be fully produced. Such a phenomenon occurs between the motion mechanisms in the semiconductor exposure apparatus. This problem is important in an apparatus for which high-precision positioning performance is required. In addition, changes in the characteristics of the above motion mechanisms over time must be quickly and quantitatively monitored for the maintenance of the motion mechanisms so as to always keep their performance constant.

Under the circumstances, to form a control system for producing the maximum performance of the motion mechanisms, the characteristics of the motion mechanisms must be quantitatively monitored. The characteristics of the motion mechanisms are defined by viscous damping coefficients, spring constants, resonance frequencies of the mechanisms, and the like. Apparatus design and maintenance can be optimized by quantitatively monitoring these physical parameters and elaborately reflecting the resultant data in control system design. There is no doubt that the characteristics of a control system designed on the basis of optimal and quantitative physical parameters in consideration of the positioning performance required for a movable portion and dynamic conditions such as driving forces to be applied are superior to those of a control system designed without considering such physical parameters.

Modeling of the physical behaviors of motion mechanisms (an X-Y stage, a fine adjustment stage, a anti-vibration mechanism, and the like) as controlled objects is indispensable for the design of a control system. Physical modeling is performed on the basis of the physical laws of dynamics or electromagnetism, and design of an optimal control system allows excellent control on motion mechanisms in a desired state.

A physical model of a small-scale motion mechanism with its actual behavior reflecting therein can be formed relatively easily because the model precisely coincides with the behavior. For a large-scale system formed by combining a plurality of motion mechanisms, parameter approximation, e.g., evaluation of the rigidity of mechanical units and estimation of forces to be generated, is required, and hence an approach using a physical model is not effective in terms of precise control system design.

Even when a control system is designed on the basis of a precise physical model, since a plurality of motion mechanisms aiming at industrial machines is produced, variations in the characteristics of the respective machines must be managed. Even in a plurality of apparatuses based on the same design, the motion mechanisms of the respective apparatuses vary in characteristics owing to slight differences between parts working processes and assembly conditions (e.g., assembly torque). Therefore, design and manufacturing based on the assumption that each apparatus is tuned to an optimal condition are not suited for the mass production of apparatuses.

In addition, the mechanical characteristics (e.g., the frictional resistance and the like of a sliding portion) of a motion mechanism changes over time upon operation of the motion mechanism. This degrades the control performance. When the frictional resistance increases, a positional deviation with respect to a target position remains, resulting in a positioning error. In the worst case, a failure or destruction occurs. For this reason, periodical maintenance is required for the motion mechanism.

The most common method employed in the industrial field to monitor the characteristics of a plurality of motion mechanisms and quantitatively monitor changes in the characteristics of the motion mechanisms over time at the sites of design and production is a method of acquiring frequency characteristic data based on frequency responses. The frequency characteristic data can be acquired by using a measuring device called a frequency response analyzer (popularly called a servo analyzer/FFT (Fast Fourier Transform) analyzer). By using a sine wave sweep method of inputting a sine wave to a controlled object and obtaining a frequency transfer function by changing the frequency in small units, a precise frequency transfer function can be obtained with small increments of frequencies.

A sine wave is input to a target motion mechanism as the amplitude of an input waveform used to vibrate the motion mechanism. The ratio (gain) of this amplitude to the amplitude of a response waveform in a steady state and the phase are measured, and gain and phase characteristics at many measurement points are plotted on a Bode diagram, thereby empirically evaluating the response characteristics and positioning performance of the motion mechanism.

The dynamic characteristics of the motion mechanism are monitored from these characteristics and are reflected in design. By calculating the physical parameters of a plurality of motion mechanisms, the locations of variations are detected. In addition, the performance of a closed loop system provided for a motion mechanism can be grasped by using a gain margin and phase margin which are known in a control theory, and a deterioration in performance is grasped by monitoring the trend of this index over time.

Although measurement data obtained by a frequency response analyzer is useful as data for analyzing the characteristics of a motion mechanism, the measurement data is not used for a control law or maintenance in accordance with a change in the characteristics of the motion mechanism over time. Data conversion into data other than frequency response data is not impossible, but is not executed in practice. That is, the utilization efficiency of this data is poor in spite of the fact that the data is measured by spending a lot of time. This is because empirically obtained frequency transfer functions, and the like, are visible information for evaluating the system, and the frequency transfer function must be rewritten by using a sophisticated technique such as curve fitting so as to write the information as physical models and apply them to control system design. In addition, to obtain parameters for a control system, e.g., a mass, rigidity, viscous damping coefficients, and the like, from the frequency transfer function, this information must be decomposed into discrete data of n-degrees-of-freedom, which are necessary and sufficient for writing the characteristics of an actual motion mechanism as a continuous system (having infinite-degrees-of-freedom).

Assume that the natural frequency of a target motion mechanism is low. In this case, to acquire high-precision frequency characteristics, low-frequency signals of several periods must be input while measurement is performed with small increments of sampling frequencies, thus averaging measurement data. In this manner, appropriate measurement conditions must be set. As the natural frequency of a target motion mechanism is low, the measurement time is prolonged. It should be noted that when the empirical method requiring much measurement time is applied to a plurality of apparatuses in action at the site of production, sine waves are input to the motion mechanisms with a large load. When a measurement method demanding much time is used to grasp variations in characteristics among motion mechanisms of the same type, the method becomes a big factor that decreases productivity. To fully enhance the required measurement performance and perform necessary and sufficient analysis at the sites of design and production, a man-machine interface for an operator, e.g., display of measurement results, data conversion (A/D, D/A), and setting of measurement ranges, is an important factor.

To grasp variations in the characteristics of motion mechanisms with time, diagnosis accompanying measurement must be periodically performed to monitor the trend of obtained measurement results. However, the shutdown of production of ICs by using a semiconductor exposure apparatus must be avoided whenever possible. Therefore, measurement for periodic maintenance and diagnosis needs to be completed in a short period of time. However, measurement using a conventional frequency response analyzer cannot meet the above demand. Under the circumstances, there have been demands for realization of a measurement method of performing measurement in a short period of time with a high analysis precision and an exposure apparatus or anti-vibration apparatus in which the measurement method is implemented as hardware or software.

SUMMARY OF THE INVENTION

The present invention has been made in consideration of the above problems in the prior art, and has as its object to provide an anti-vibration apparatus which performs system identification to accurately measure the characteristics of a motion mechanism in a short period of time without imposing a significant load on the motion mechanism, and removes disturbances by reflecting the identification result in a control law as a change in characteristics over time, an exposure apparatus which realizes stable exposure performance on the basis of identification and damping, and a method of manufacturing a semiconductor device by using the exposure apparatus. In order to achieve the above object, the present invention is characterized by the following arrangements.

There is provided an exposure apparatus comprising pseudo-random signal generating means for generating a pseudo-random signal and applying the pseudo-random signal to an actuator for controlling operation of a motion mechanism, data storage means for collecting time-series data obtained by a sensor for measuring an operation state of the motion mechanism, together with time-series data of the pseudo-random signal, pre-filtering means for filtering the time-series data stored in the data storage means, system identification means for deriving a mathematical model from the data processed by the pre-filtering means, and characteristic extraction/diagnosis means for deriving a characteristic value of the motion mechanism by using the mathematical model derived by the system identification means.

There is provided an anti-vibration apparatus comprising pseudo-random signal generating means for generating a pseudo-random signal and applying the signal to an actuator for controlling a motion of a motion mechanism, data storage means for collecting and storing time-series data obtained by a sensor for measuring a motion state of the motion mechanism, together with the time-series data of the pseudo-random signal, pre-filtering means for filtering the time-series data stored in the data storage means, system identification means for deriving a mathematical model from the data processed by the pre-filtering means, and characteristic extraction/diagnosis means for deriving a characteristic value of the motion mechanism by using the mathematical model derived by the system identification means.

There is provided a system identification method comprising the steps of applying a pseudo-random signal to an actuator for controlling a motion of a motion mechanism, collecting time-series data obtained by a sensor for measuring a motion state of the motion mechanism, together with time-series data of the pseudo-random signal, and storing the data in data storage means, filtering the time-series data stored in the data storage means, identifying a system by using the filtered data, and deriving a characteristic value of the motion mechanism by using a mathematical model calculated by identification of the system.

There is provided a device manufacturing method comprising the steps of preparing the exposure apparatus defined in the claims, and manufacturing a device by using the prepared exposure apparatus.

There is provided an exposure apparatus comprising means for inputting a reference signal to the apparatus, means for exciting the apparatus on the basis of the input signal, means for acquiring an excitation result of the apparatus as an output signal, means for identifying a characteristic of the apparatus on the basis of the reference signal and the output signal, and means for capturing the identified characteristic over time and self-diagnosing a change in the characteristic of the apparatus.

There is provided an anti-vibration apparatus comprising means for inputting a reference signal to one motion mechanism, means for exciting the one motion mechanism on the basis of the input signal, means for acquiring an excitation result of the one motion mechanism relative to another motion mechanism mounted on the motion mechanism as an output signal, means for identifying a characteristic of the apparatus including a plurality of motion mechanisms on the basis of the reference signal and the output signal, and means for capturing the identified characteristic over time and self-diagnosing a change in the characteristic of the apparatus.

There is provided an exposure apparatus comprising means for damping vibrations of a motion mechanism by using the above anti-vibration apparatus.

There is provided a system identification apparatus comprising means for generating an input signal as a reference to be supplied to a target system in order to identify a characteristic of the target system, means for converting the input signal and an output signal corresponding to the input signal into analog or digital data, means for setting an acquisition condition for the output signal, means for performing a computation for identifying the characteristic of the target system on the basis of the input signal and the output signal, and display control means for displaying the identification computation result on the basis of the set acquisition condition.

There is provided a system identification apparatus comprising signal generating means for generating an input signal as a reference to be supplied to a target system in order to identify a characteristic of the target system, driving means for driving the target system by distributing the input signal, a sensor for measuring a motion state of the target system, data collecting means for storing a signal generated by the signal generating means and an output signal from the sensor as time-series data, and identification computation means for modeling the characteristic of the target system on the basis of the input signal and the output signal, wherein the identification computation means self-diagnoses a change in the characteristic of the target system on the basis of the time-series data stored in the data collecting means.

There is provided an exposure apparatus comprising means for self-diagnosing a change in a characteristic of the exposure apparatus in a time-series manner by using the above system identification apparatus, and means for generating a control law required to maintain exposure performance on the basis of the self-diagnosis result, wherein the performance is maintained by compensating for changes in characteristics of mechanical and electrical elements of the exposure apparatus over time.

There is provided a method of identifying a dynamic characteristic of a system, comprising the step of generating a reference input signal to be applied to the target system to identify a characteristic of the target system, the step of converting the input signal and an output signal corresponding to the input signal into analog or digital data, the step of setting an acquisition condition for the output signal, the step of performing a computation to identify the characteristic of the target system on the basis of the input signal and output signal; and the display control step of displaying a result of the identification computation on the basis of the set acquisition condition.

There is provided a method of identifying a dynamic characteristic of a system, comprising the step of generating a reference input signal to be applied to the target system to identify a characteristic of the target system, the step of converting the input signal and an output signal corresponding to the input signal into analog or digital data, the step of setting an acquisition condition for the output signal, the step of performing a computation to identify the characteristic of the target system on the basis of the input signal and output signal, and the display control step of displaying a result of the identification computation on the basis of the set acquisition condition.

According to a preferred aspect of the present invention, the pseudo-random signal generating means in the exposure apparatus simultaneously applies to all the actuators a plurality of uncorrelated pseudo-random signals exhibiting a one-to-one correspondence with a plurality of actuators arranged in the motion mechanism for control.

According to another preferred aspect of the present invention, the pseudo-random signal generating means in the exposure apparatus comprises switch means for applying one pseudo-random signal to each actuator arranged in the motion mechanism for control.

According to still another preferred aspect of the present invention, the pseudo-random signal generating means in the exposure apparatus simultaneously applies, in correspondence with degrees-of-freedom of motion, a plurality of pseudo-random signals which are equal in number to the number of the degrees-of-freedom of motion of the motion mechanism and uncorrelated with each other.

According to still another preferred aspect of the present invention, the pseudo-random signal generating means in the exposure apparatus comprises switch means for independently applying one pseudo-random signal in units of degrees-of-freedom of operation of the motion mechanism.

According to still another preferred aspect of the present invention, the characteristic value in the exposure apparatus includes at least one or all of a frequency response, a physical parameter of the motion mechanism, a resonance frequency, a damping ratio, a gain margin, a phase margin, and physical information of a portion in the exposure apparatus at which measurement cannot be performed.

According to still another preferred aspect of the present invention, the actuator in the exposure apparatus is an electromagnetic motor.

According to still another preferred aspect of the present invention, the motion mechanism in the exposure apparatus is an active anti-vibration apparatus for damping/supporting a main body structure of the exposure apparatus.

According to still another preferred aspect of the present invention, the motion mechanism in the exposure apparatus is externally mounted on the exposure apparatus to perform system identification.

According to still another preferred aspect of the present invention, the pseudo-random signal in the exposure apparatus is an M-sequence signal.

According to still another preferred aspect of the present invention, the pseudo-random signal generating means in the anti-vibration apparatus simultaneously applies to all the actuators a plurality of uncorrelated pseudo-random signals exhibiting a one-to-one correspondence with a plurality of actuators arranged in the motion mechanism for control.

According to still another preferred aspect of the present invention, the pseudo-random signal generating means in the anti-vibration apparatus comprises switch means for applying one pseudo-random signal to each actuator arranged in the motion mechanism for control.

According to still another preferred aspect of the present invention, the pseudo-random signal generating means in the anti-vibration apparatus simultaneously applies, in correspondence with degrees-of-freedom of motion, a plurality of pseudo-random signals which are equal in number to the number of the degrees-of-freedom of motion of the motion mechanism and uncorrelated with each other.

According to still another preferred aspect of the present invention, the pseudo-random signal generating means in the anti-vibration apparatus comprises switch means for independently applying one pseudo-random signal in units of degrees-of-freedom of operation of the motion mechanism.

According to still another preferred aspect of the present invention, the characteristic value in the anti-vibration apparatus includes at least one or all of a frequency response, a physical parameter of the motion mechanism, a resonance frequency, a damping ratio, a gain margin, a phase margin, and physical information of a portion in the exposure apparatus at which measuring cannot be performed.

According to still another preferred aspect of the present invention, the actuator in the anti-vibration apparatus is an electromagnetic motor.

According to still another preferred aspect of the present invention, the motion mechanism in the anti-vibration apparatus damps/supports a main body structure of the exposure apparatus.

According to still another preferred aspect of the present invention, the motion mechanism in the anti-vibration apparatus is externally mounted on the exposure apparatus to perform system identification.

According to still another preferred aspect of the present invention, the pseudo-random signal in the anti-vibration apparatus is an M-sequence signal.

According to still another preferred aspect of the present invention, in the system identification method, as the pseudo-random signal, a plurality of uncorrelated pseudo-random signals exhibiting a one-to-one correspondence with a plurality of actuators which the motion mechanism has for control are simultaneously applied to all the actuators.

According to still another preferred aspect of the present invention, in the system identification method, as the pseudo-random signal, one pseudo-random signal is independently applied through switch means to each actuator arranged in the motion mechanism for control.

According to still another preferred aspect of the present invention, in the system identification method, as the pseudo-random signal, a plurality of pseudo-random signals which are equal in number to the number of degrees-of-freedom of motion of the motion mechanism and uncorrelated with each other are simultaneously applied in correspondence with the degrees-of-freedom of motion.

According to still another preferred aspect of the present invention, in the system identification method, the pseudo-random signal generating means independently applies one pseudo-random signal in units of degrees-of-freedom of operation of the motion mechanism through switch means.

According to still another preferred aspect of the present invention, in the system identification method, the characteristic value includes at least one or all of a frequency response, a physical parameter of the motion mechanism, a resonance frequency, a damping ratio, a gain margin, a phase margin, and physical information of a portion in the exposure apparatus at which measuring cannot be performed.

According to still another preferred aspect of the present invention, in the system identification method, the motion mechanism is an active anti-vibration apparatus for damping/supporting a main body structure of the exposure apparatus.

According to still another preferred aspect of the present invention, in the system identification method, the motion mechanism is externally mounted on the exposure apparatus to perform system identification.

According to still another preferred aspect of the present invention, in the system identification method, the pseudo-random signal is an M-sequence signal.

According to still another preferred aspect of the present invention, the exposure apparatus further comprises means for notifying an abnormality when a characteristic value of the apparatus exceeds a predetermined reference value upon the self-diagnosis.

According to still another preferred aspect of the present invention, the characteristic of the exposure apparatus is defined by at least one of a frequency response, a resonance frequency, a damping ratio, a gain margin, and a phase margin.

According to still another preferred aspect of the present invention, in the exposure apparatus, the means for acquiring the output signal is arranged in the same coordinate axis direction as that of excitation of the apparatus.

According to still another preferred aspect of the present invention, in the exposure apparatus, the means for acquiring the output signal includes at least one of an acceleration sensor, a position sensor, and a pressure sensor.

According to still another preferred aspect of the present invention, in the anti-vibration apparatus, the means for acquiring the relative excitation result as the output signal is a laser interferometer.

According to still another preferred aspect of the present invention, in the system identification apparatus, the input signal generated by the means for generating the input signal is a white signal, a pseudo white binary signal, or an M-sequence (Maximum-length linear shift register sequence) signal.

According to still another preferred aspect of the present invention, in the system identification apparatus, the means for setting the acquisition condition for the output signal makes a setting for separately receiving each signal from a plurality of signal acquisition means for measuring a response of the target system to an input signal in accordance with a signal to be received, and separately sets a detection sensitivity of each of the signal acquisition means for which the setting has been made.

According to still another preferred aspect of the present invention, in the system identification apparatus, the display control means displays both or one of a gain diagram and phase diagram of a frequency characteristic or a pole-zero assignment diagram on the basis of an identification result.

According to still another preferred aspect of the present invention, in the system identification apparatus, the display control means displays discrete coefficient elements of a difference equation or differential equation for physically writing a characteristic of the target system on display means on the basis of an identification result.

According to still another preferred aspect of the present invention, the discrete coefficient elements include a mass component of the target system, a resonance frequency defining rigidity, and a damping coefficient.

According to still another preferred aspect, in the system identification apparatus, when the setting is made to receive a plurality of reception signals, the display control means displays identification results based on the respective reception signals on the display means upon dividing a screen display.

According to still another preferred aspect of the present invention, in the system identification apparatus, the means for performing the computation for identifying the characteristic of the target system performs identification computations in directions of three-degrees-of-freedom of translation and directions of three-degrees-of-freedom of rotation.

According to still another preferred aspect of the present invention, the system identification apparatus further comprises first auxiliary computation means for performing linear coordinate conversion processing or filtering for a signal generated by the signal generating means, and the signal obtained by the processing forms a correlation with the signal generated by the signal generating means.

According to still another preferred aspect of the present invention, in the system identification apparatus, the first auxiliary computation means sets, as inputs, signals generated by the signal generating means and corresponding to motion modes of translation and rotation of the target system, and also sets, as outputs, driving commands for exerting translation thrust forces and moments of rotation in accordance with signals corresponding to a plurality of driving means.

According to still another preferred aspect of the present invention, the system identification apparatus further comprises a force sensor for measuring a driving force of the driving means with respect to the target system, and the data collecting means stores time-series data of an output signal from the force sensor or a signal obtained by appropriate processing of the output signal, as a signal corresponding to a driving command for the driving means to be the target system.

According to still another preferred aspect of the present invention, in the system identification apparatus, the data collecting means stores time-series data of signals which are extracted by performing arithmetic processing for output signals from the force sensor and correspond to a translation thrust force and a moment of rotation exerted from the driving means to the target system.

According to still another preferred aspect of the present invention, the system identification apparatus further comprises second auxiliary computation means for performing appropriate arithmetic processing for an output signal from the sensor for measuring a motion state of the target system, and the data collecting means stores time-series data of an output signal from the second auxiliary means as a motion state of the target system in place of an output signal from the sensor.

According to still another preferred aspect of the present invention, in the system identification apparatus, the second auxiliary computation means sets output signals from a plurality of sensors as inputs, and extracts and outputs a signal corresponding to each motion mode of translation and rotation of the target system.

According to still another preferred aspect of the present invention, in the system identification apparatus, the signal generating means generates a pseudo-random signal.

According to still another preferred aspect of the present invention, in the system identification apparatus, the signal generating means generates a plurality of uncorrelated pseudo-random signals.

According to still another preferred aspect of the present invention, in the system identification apparatus, the pseudo-random signal is an M-sequence signal.

According to still another preferred aspect of the present invention, in the system identification apparatus, the identification computation means derives a model representing an input/output characteristic of the target system by applying a subspace identification method to the time-series data stored in the data collecting means with a driving command from the driving means to the target system being set as an input, and a motion state of the target system being set as an output.

According to still another preferred aspect of the present invention, in the system identification apparatus, the model derived by the identification computation means is equal in degree to a state equation derived from an equation of motion of the target system, which includes an unknown physical characteristic value to be derived.

According to still another preferred aspect of the present invention, in the system identification apparatus, the identification computation means compares a characteristic polynomial formed on the basis of the state equation of the target system, which includes an unknown physical characteristic value to be derived, with a characteristic polynomial of the target system which is derived from a mathematical mode based on the input/output characteristic of the target system, determines an unknown coefficient from comparison between corresponding coefficients, and derives the unknown physical characteristic value.

According to still another preferred aspect of the present invention, in the system identification apparatus, the unknown physical characteristic value determined by the comparison between coefficients of the characteristic polynomials is derived by searching for a coefficient value that minimizes the sum of squares of corresponding coefficients of the characteristic polynomials.

According to still another preferred aspect of the present invention, the signal generating means generates a sine sweep signal.

According to still another preferred aspect of the present invention, in the system identification apparatus, a model representing the characteristic of the target system, which is derived by the identification computation means, is derived as a characteristic polynomial using an eigenvalue of the target system, which is obtained from a frequency response of input/output operation, as a characteristic root.

According to still another preferred aspect of the present invention, in the system identification apparatus, the identification computation means derives a physical characteristic value including a mass, moment of inertia, and product of inertia of the target system as an unknown physical characteristic value.

According to still another preferred aspect of the present invention, in the system identification apparatus, the identification computation means compares a characteristic polynomial formed on the basis of a state equation of the target system, which includes a difference as an unknown parameter between a center of gravity virtually set as a center of gravity of a movable portion of the target system, and a true center of gravity, with a characteristic polynomial derived from a mathematical model based on an input/output characteristic of the target system in order to specify a center of gravity of the movable portion of the target system, and specifies the true center of gravity by determining an unknown coefficient upon comparison between corresponding coefficients.

According to still another preferred aspect of the present invention, in the system identification apparatus, the identification computation means self-diagnoses a change in a characteristic of the target system on the basis of the time-series data stored in the data collecting means, and notifies an abnormality when the change exceeds an allowable value required to maintain performance.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 20 is a view showing an arrangement for supporting the motion mechanism with six-degrees-of-freedom (translation and rotation in the X, Y, and Z directions);

FIGS. 23A to 23F are graphs each showing examples of input and output signals;

FIG. 24 is a view showing the positional relationship between a true center of gravity G of the motion mechanism and a virtual center of gravity G'.

DETAILED DESCRIPTION OF THE PREFERRED EMBODIMENTS

Preferred embodiments of the present invention will be described in detail in accordance with the accompanying drawings.

First Embodiment

Figure 2:
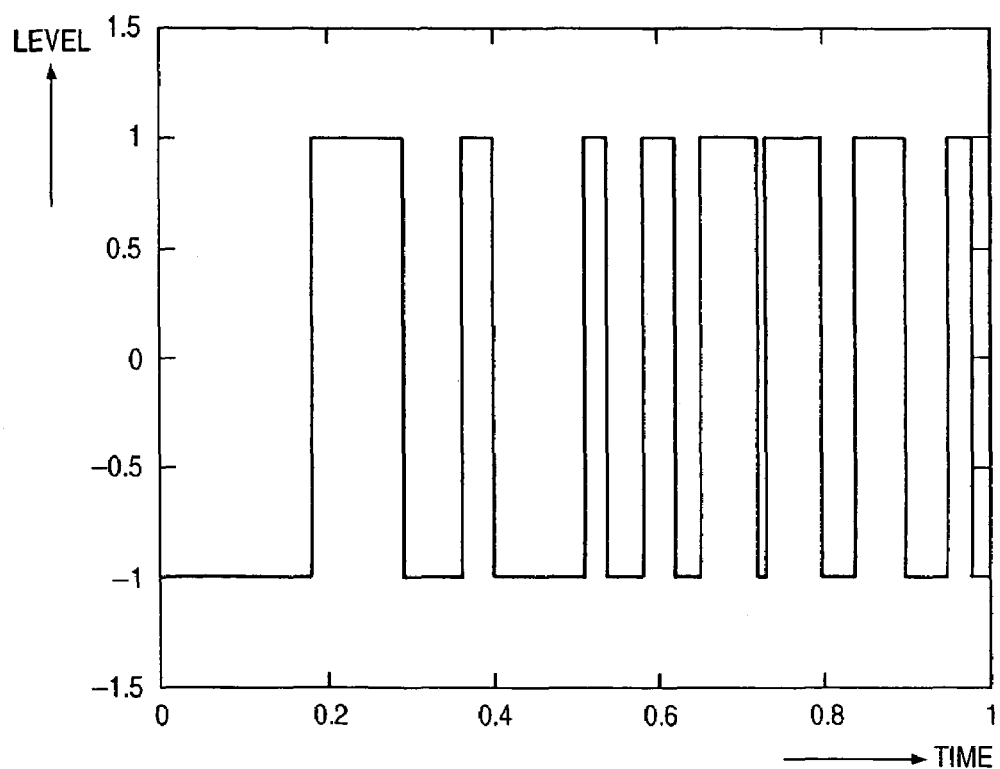
FIG. 2 is a graph showing an example of the output waveform of an M-sequence.
Figure 3:
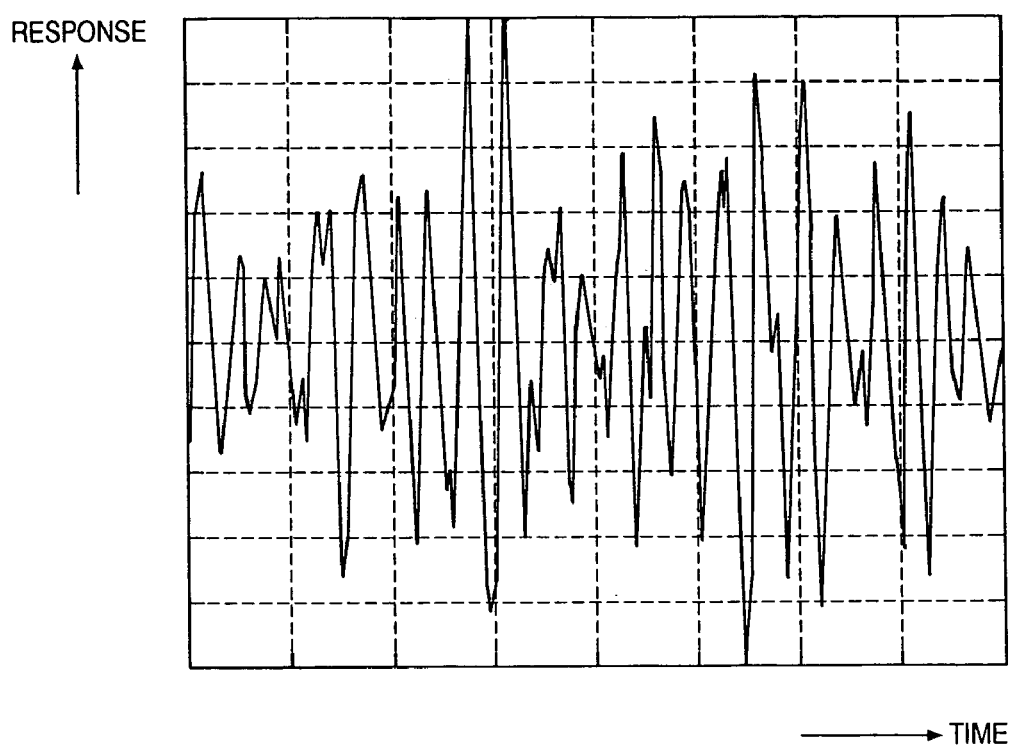
FIG. 3 is a graph showing an example of a response waveform upon a vibrating operation using the M-sequence.

An M-sequence as a signal for vibrating a motion mechanism will be described first prior to a detailed description of the embodiments. An M-sequence (Maximum-length linear shift register sequence) is a type of pseudo-random signal. FIG. 2 shows an example of an output waveform. FIG. 3 shows an example of a response waveform when the motion mechanism in a semiconductor exposure apparatus is vibrated by using an M-sequence. As shown in FIG. 2, the M-sequence is a pattern of a random repetition of +1 and −1 and has been known as an input signal for system identification. However, there are only a few applications of this signal to actual mechanical systems. For example, in Adachi et al., "Comparison between Prediction Error Method and Sequence Method Using Identification Experimental Data on ETS-VI Orbit", the Transactions of Institute of Measurement Automatic Control, Vol. 33, No. 8, pp. 805–811 (1197), it was reported that an identification experiment was conducted to estimate the flexible structure parameters of a technical test satellite ETS-VI. However, any application to a large-scale multi-variable mechanical system is unknown. Currently, therefore, utility values for signal processing methods for industrial apparatuses have not been clear.

Under the circumstances, a semiconductor manufacturing apparatus (stepper or scanner) in this embodiment newly incorporates a system identification function using M-sequences as vibrating signals as software or hardware. This provides an apparatus arrangement based on sufficient consideration of the characteristics of a motion mechanism, and clearly exhibits the advantages which a semiconductor exposure apparatus as an industrial apparatus can enjoy.

For easy understanding of the technical contents of the present invention, this embodiment will exemplify an active anti-vibration apparatus as an application to a motion mechanism. Obviously, the application of the technical scope disclosed in the present invention is not limited to the active anti-vibration apparatus, and can be applied to other motion mechanisms in the semiconductor exposure apparatus, e.g., an X-Y stage. Likewise, an external motion mechanism may be prepared to perform system identification disclosed in the present invention instead of a motion mechanism incorporated as a semiconductor exposure apparatus. As external motion mechanisms, for example, a vibrator and a mass damper may be presented.

Figure 1:
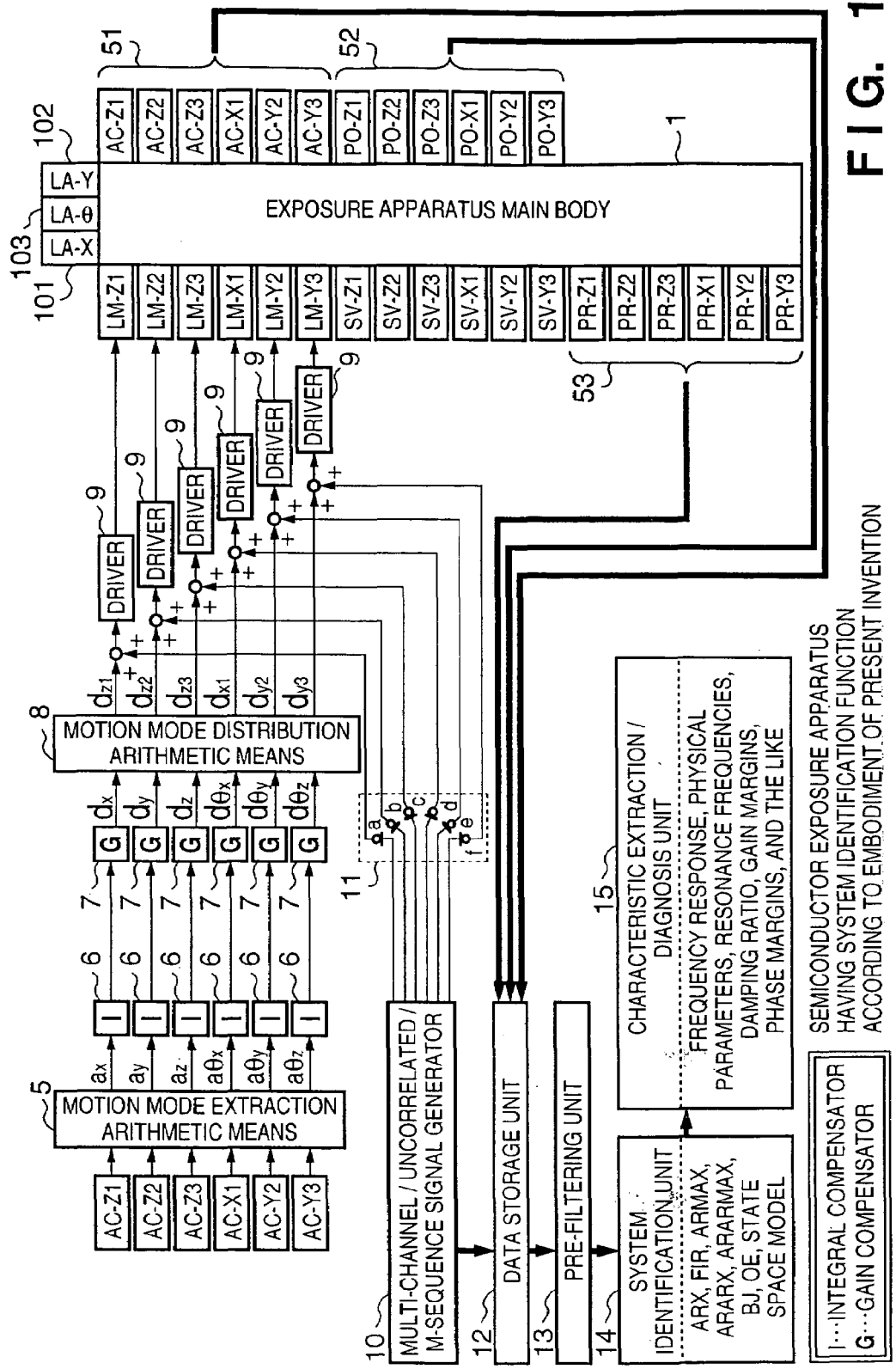
FIG. 1 is a block diagram showing the arrangement of a semiconductor exposure apparatus having a system identification function according to an embodiment of the present invention.

FIG. 1 is a block diagram showing an application of the present invention to an active anti-vibration apparatus in a semiconductor manufacturing apparatus. Referring to FIG. 1, reference numeral 1 denotes an exposure apparatus main body on which sensors and actuators which are used to control an anti-vibration table are mounted. Reference symbol AC denotes an acceleration sensor 51 serving as a vibration detection means; PO, a position sensor 52 serving as a position measurement means; SV, a servo valve for controlling the supply/discharge of a working fluid to/from an air spring (not shown) for supporting the apparatus main body including a heavy anti-vibration table; and LM, an electromagnetic motor for mainly suppressing transient vibrations of the anti-vibration table. The symbols attached to these symbols denoting sensors and actuators together with the hyphens "-" represent the azimuths and positions of the corresponding components on the anti-vibration table. The azimuths and positions will be more apparent by referring to FIG. 4.

Figure 4:
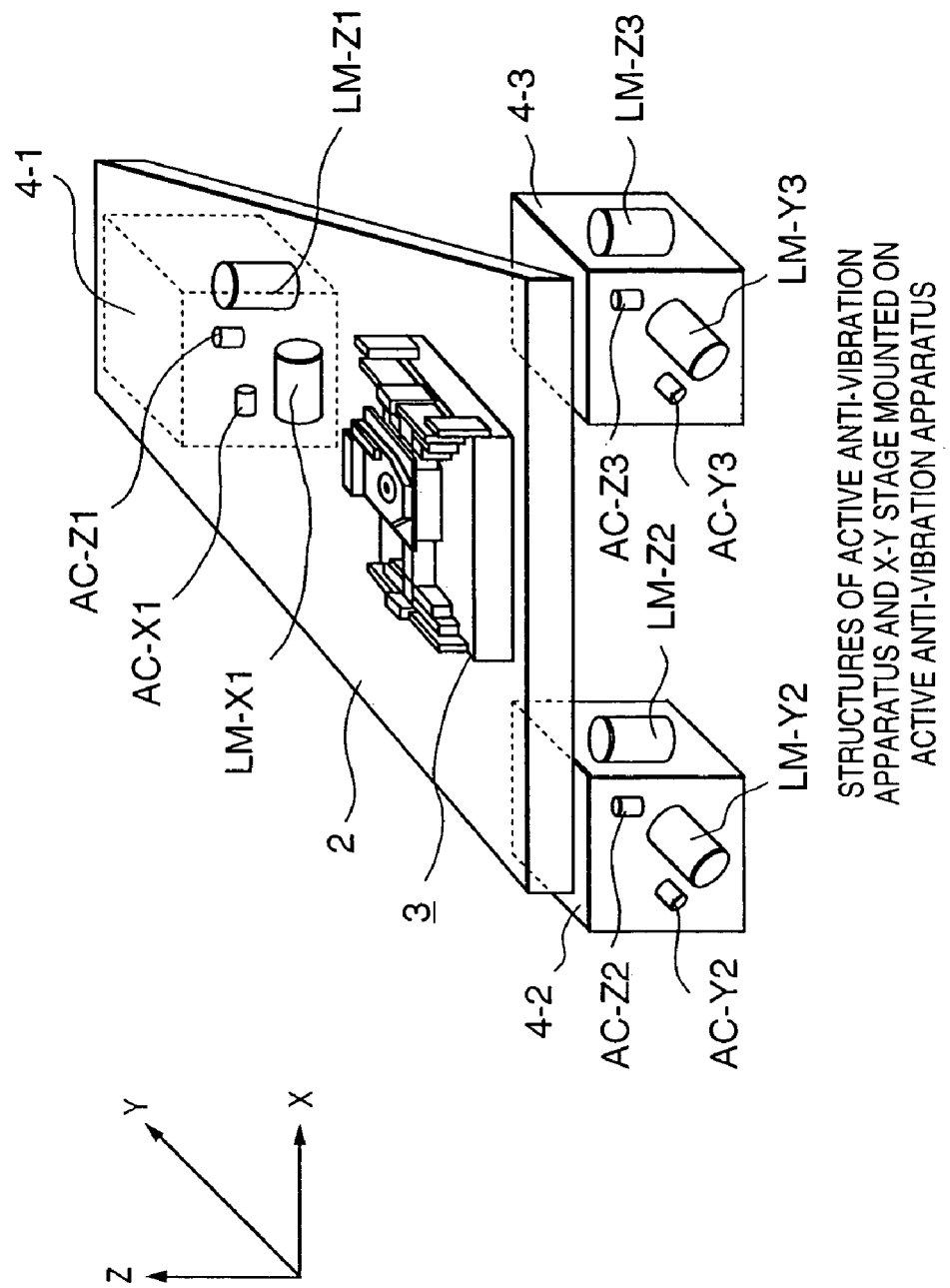
FIG. 4 is a perspective view showing the structures of an active anti-vibration apparatus and an X-Y stage mounted thereon.

Referring to FIG. 4, an X-Y stage 3 is mounted on an anti-vibration table 2. These components are supported by active mounts 4-1, 4-2, and 4-3 incorporating sensors and actuators. Reference symbol AC-X1 denotes a vibration measurement means in the active mount 4-1. This means is positioned to measure vibrations in the X direction. Note that of the SV, position measurement means PO, and pressure measurement means PR are not illustrated in FIG. 4.

The arrangement of a vibration control system using the electromagnetic motors LM will be described by referring back to FIG. 1. First of all, outputs from acceleration sensors AC-Z1, AC-Z2, AC-Z3, AC-X1, AC-Y2, and AC-Y3 are guided to a motion mode extraction arithmetic means 5, which obtains signals for motion modes such as translation and rotation of the anti-vibration table 2, i.e., motion mode acceleration signals (ax, ay, az, aθx, aθy, aθz). These signals are supplied to an integral compensator 6 to be converted into velocity signals for the respective motion modes. The velocity signals are supplied to a gain compensator 7 for adjusting damping in each motion mode. The output signals from the gain compensator 7 become motion mode driving signals (dx, dy, dz, dθx, dθy, dθz). These signals are processed by a motion mode distribution arithmetic means 8 to become driving signals (dz1, dz2, dz3, dx1, dy2, dy3) to be generated by the respective actuators for the active mounts. Drivers 9 are then excited by these signals. With this arrangement of the vibration control system, the vibration characteristics of the anti-vibration table 2 can be adjusted in units of motion modes with little interference.

Addition terminals are connected to the input stages of the drivers 9 of the vibration control system for the electromagnetic motors LM described above. The outputs of a multi-channel/uncorrelated/M-sequence signal generator 10 are connected to these addition terminals through a switch 11. The switch 11 serves to manage ON/OFF operation for connection to all the electromagnetic motors LM in the active mounts. In the case shown in FIG. 1, all the electromagnetic motors LM are activated by M-sequence signals. Note that M-sequence signals output from the M-sequence signal generator 10 are uncorrelated, and hence all the electromagnetic motors of the active mounts 4 are driven by the uncorrelated M-sequence signals. The behavior of the anti-vibration table 2 in action can be monitored in accordance with output signals from sensors for measuring motion states, including the vibration measurement means AC, position measurement means PO, and pressure measurement means PR. These data are collected in a data storage unit 12, together with the signals from the M-sequence signal generator 10. That is, vibrating operation based on M-sequences is characterized by being performed in one step.

The time-series data collected in the data storage unit 12 are transferred to a pre-filtering unit 13 to be filtered. A system identification unit 14 then performs identification for the filtered input/output data. The system identification performed in this case is to acquire mathematical models by using the input/output data. As mathematical models, for example, ARX, FIR, ARMAX, ARARX, ARARMAX, BJ, OE, and state/space models, are selected as needed. A description of these mathematical models will be omitted. For further information, refer to Shuichi Adachi, "System Identification for Control Based on MATLAB" (Tokyo Denki University Press). Finally, the mathematical models acquired by the system identification unit 14 are sent to a characteristic extraction/diagnosis unit 15, which performs data conversion for characteristic extraction and diagnosis.

Since all the electromagnetic motors LM of the active anti-vibration apparatus are vibrated at once by using uncorrelated M-sequence signals, the measurement time is very short. Recently, multi-channel servo analyzers have come on the market. However, the measurement time in a vibrating operation in this embodiment is much shorter than even that in a vibrating operation using such an analyzer.

Note that one signal from the multi-channel/uncorrelated/M-sequence signal generator 10 may be independently applied to each electromagnetic motor LM by turning on/off the switch 11. More specifically, only an electromagnetic motor LM-Z1 is activated first to measure an output signal from each sensor, and only an electromagnetic motor LM-Z2 is then activated to measure an output signal from each sensor. In this manner, such a measurement is independently performed in each actuator. Such an operation is incorporated as a modification of this embodiment within the scope of the present invention.

Second Embodiment

In the first embodiment, the actuators for the respective shafts of the active mounts 4 are simultaneously activated by uncorrelated signals from the multi-channel/uncorrelated/M-sequence signal generator 10. Alternatively, one of the output signals from the multi-channel/uncorrelated/M-sequence signal generator 10 is independently applied to the actuator for each axis to activate it.

Figure 5:
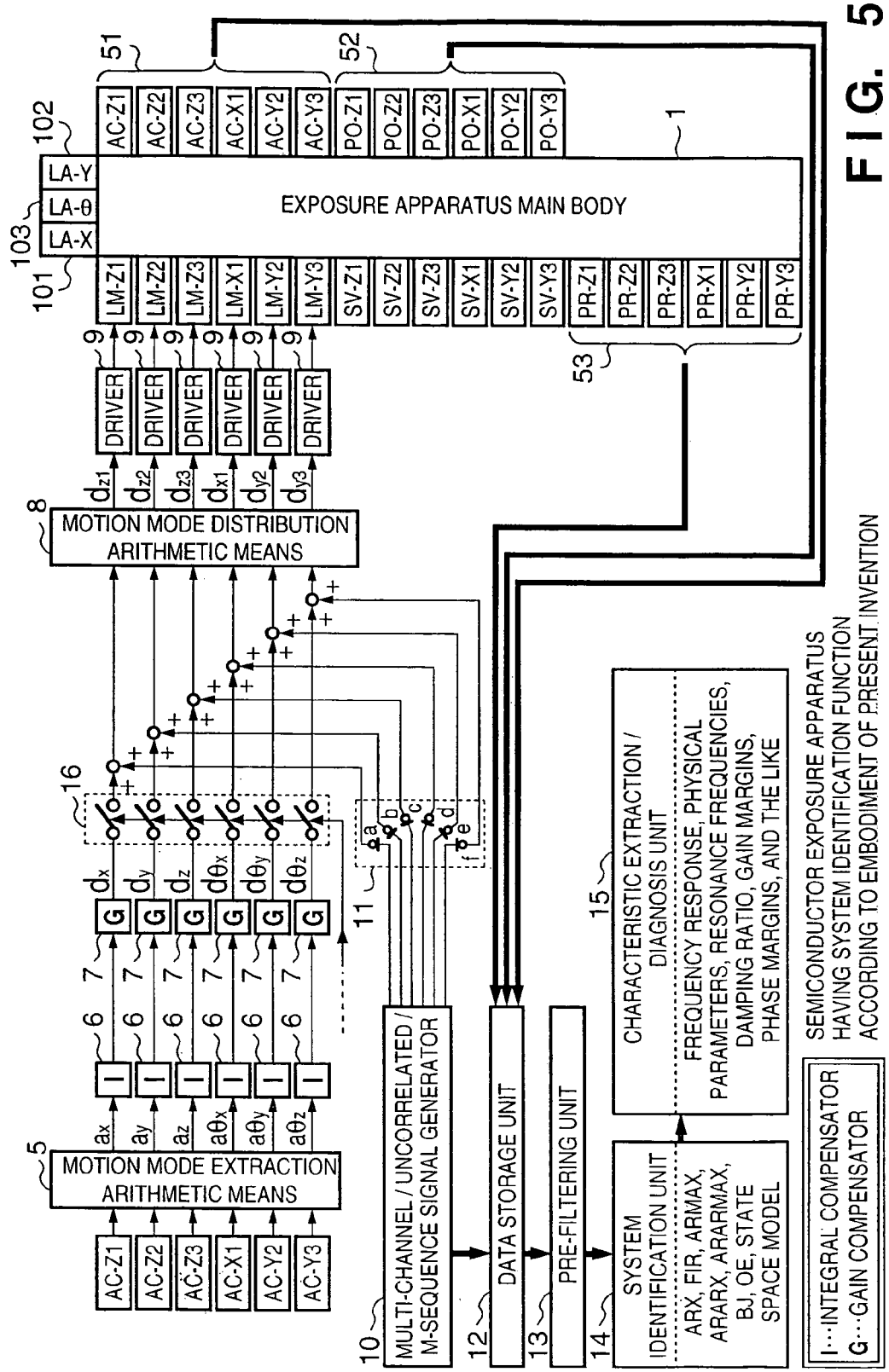
FIG. 5 is a block diagram showing the arrangement of a semiconductor exposure apparatus having a system identification function according to another embodiment of the present invention.

However, vibrating methods are not limited to these methods. The above operation can also be performed as shown in FIG. 5. Referring to FIG. 5, outputs from a multi-channel/uncorrelated/M-sequence signal generator 10 are added to the input stage of a motion mode distribution arithmetic means 8 through a switch 11. For example, an M-sequence applied through a contact c of the switch 11 is input to the motion mode distribution arithmetic means 8, together with a signal dz gain-compensated in the z direction, so as to excite electromagnetic motors LM-Z1, LM-Z2, and LM-Z3 in phase in the Z-axis direction. As a consequence, an overall anti-vibration table 2 is vibrated in the Z-axis direction. Likewise, a signal dθx gain-compensated in the rotation direction of the X-axis and an M-sequence applied through a contact d are input to the motion mode distribution arithmetic means 8 to excite an electromagnetic motor LM-X1 in the X-axis direction, thereby vibrating the anti-vibration table 2 to rotate about the X-axis. That is, this apparatus is designed to vibrate the anti-vibration table 2 in each of the orthogonal motion modes. As in the first embodiment, by turning on/off the contacts of the switch 11, all the motion modes of six-degrees-of-freedom of the rigid body of the anti-vibration table 2 can be simultaneously vibrated, or can be independently vibrated. The behavior of the anti-vibration table 2 at this time can be monitored by output signals from sensors for measuring motion states, including a vibration measurement means AC, position measurement means PO, pressure measurement means PR, and the like, mounted on an exposure apparatus main body 1. These data are collected in a data storage unit 12. Data processing after data collection is the same as that described with reference to FIG. 1, and hence, a description thereof will be omitted.

Note that a loop breaking switch 16 is added to the arrangement shown in FIG. 1. This switch is used to choose between performing vibration operation using output signals from the multi-channel/uncorrelated/M-sequence signal generator 10 in the closed loop in which electromagnetic motors LM are driven on the basis of the vibration measurement means AC and closing this loop to perform a vibrating operation in the open loop. The loop breaking switch 16 can be selectively turned on/off in accordance with the purpose of analysis of data to be acquired by the vibrating/input operation. Although the loop breaking switch 16 is omitted from the arrangement in FIG. 1, it is obvious that the apparatus in FIG. 1 can use this switch to choose between opening and closing the closed loop system using the electromagnetic motors LM in accordance with the purpose of analysis of the data.

In both the first and second embodiments, vibrating operation based on M-sequence signals is performed by using the electromagnetic motors LM. Since electromagnetic motors can vibrate a target motion mechanism up to a high frequency, they can be used as suitable actuators for system identification. The present invention is not limited to electromagnetic motors as long as other types of actuators can be properly used.

Third Embodiment

Figure 6:
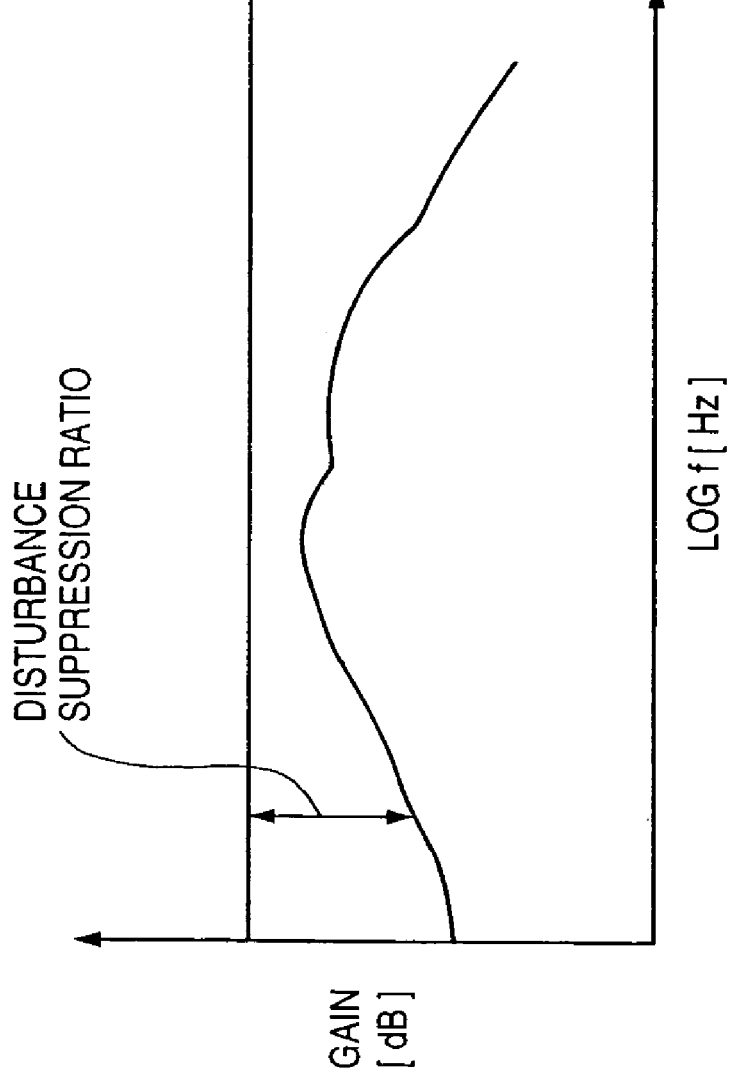
FIG. 6 is a graph showing the disturbance suppression ratio of a stage which is obtained by a vibrating operation of the active anti-vibration apparatus.

In the above embodiment, the actuators of the active anti-vibration apparatus are excited by M-sequence signals, and the resultant data are collected by the sensors of the apparatus to be analyzed. That is, the characteristics of the active anti-vibration apparatus itself are grasped. As described above, however, the performance of the motion mechanism in the semiconductor exposure apparatus does not conclude by itself. For example, the performance of the active anti-vibration apparatus greatly influences the performance of the X-Y stage 3 (FIG. 4) mounted on the anti-vibration table 2. Although it has been known that the performances of different motion mechanisms mutually influence, no quantitative analysis has been performed on such influences. In a conventional measurement method, i.e., a vibrating operation based on sine signals using a servo analyzer, very complicated measurement is required to grasp the correlation between motion mechanisms. Unlike such a conventional method, in a vibrating operation using M-sequence signals, measurement can be performed in a short period of time, and acquired data can be analyzed in various respects. For example, FIG. 6 shows a frequency response representing the disturbance suppression ratio of an X-Y stage 3. The disturbance suppression ratio is an index indicating a specific extent to which vibrations acting as disturbances on the X-Y stage 3 are suppressed. This also indicates one of the important abilities of the X-Y stage 3. Obviously, the higher the suppression ratio in FIG. 6, the better. This frequency characteristic is a characteristic value obtained by observing a positional deviation signal output from a positioning control system for the X-Y stage 3 upon a vibrating operation of the actuators of the active anti-vibration apparatus, or output signals from laser interferometers LA-X101, LY-Y102, and LA-0103 for measuring the position of the X-Y stage 3 shown in FIGS. 1 and 5. In this case, the laser interferometers LA-X101, LA-Y102, and LA-0103, respectively, measure the displacements of the X-Y stage 3 in the X and Y directions and the rotation of the X-Y stage 3 about the vertical shaft. If, therefore, the apparatus is designed to input new X-Y stage position deviation signals or laser interferometer information to the data storage unit 12 in FIG. 1 or 5, the above disturbance suppression ratio can be quickly measured.

Fourth Embodiment

The detailed contents of characteristics extracted by a characteristic extraction/diagnosis unit 15 will be described below.

Figure 7:
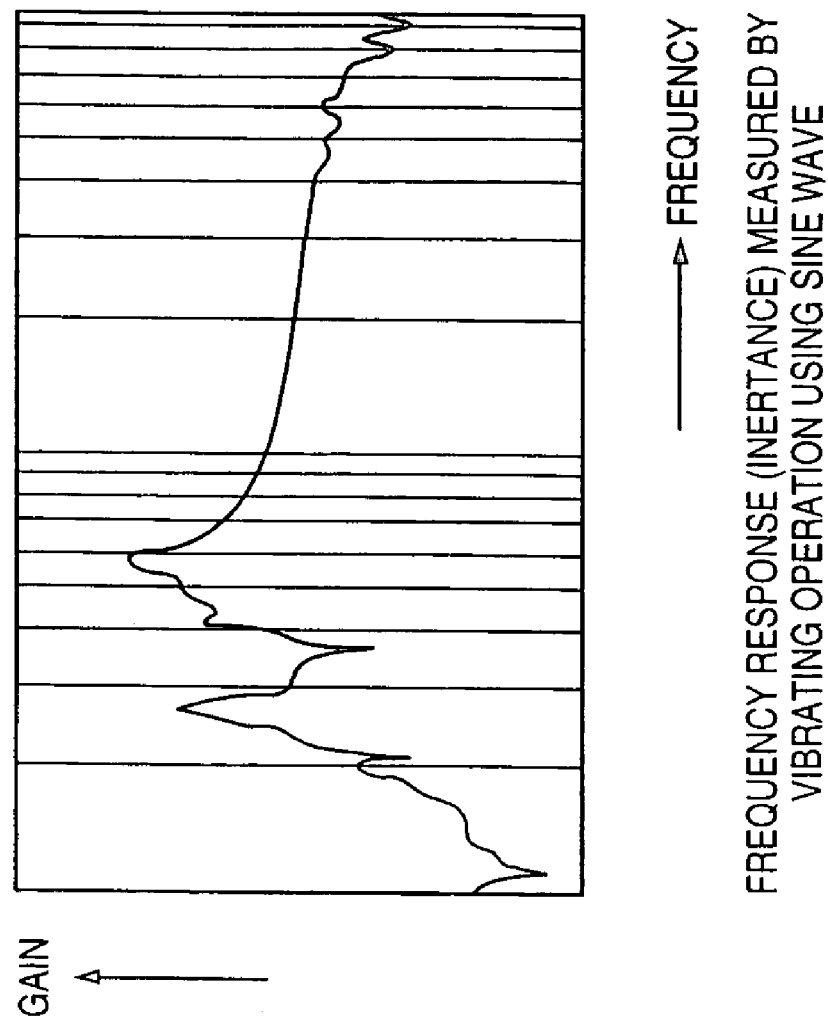
FIG. 7 is a graph showing a frequency response (inertance) measured upon a vibrating operation using a sine wave.
Figure 8:
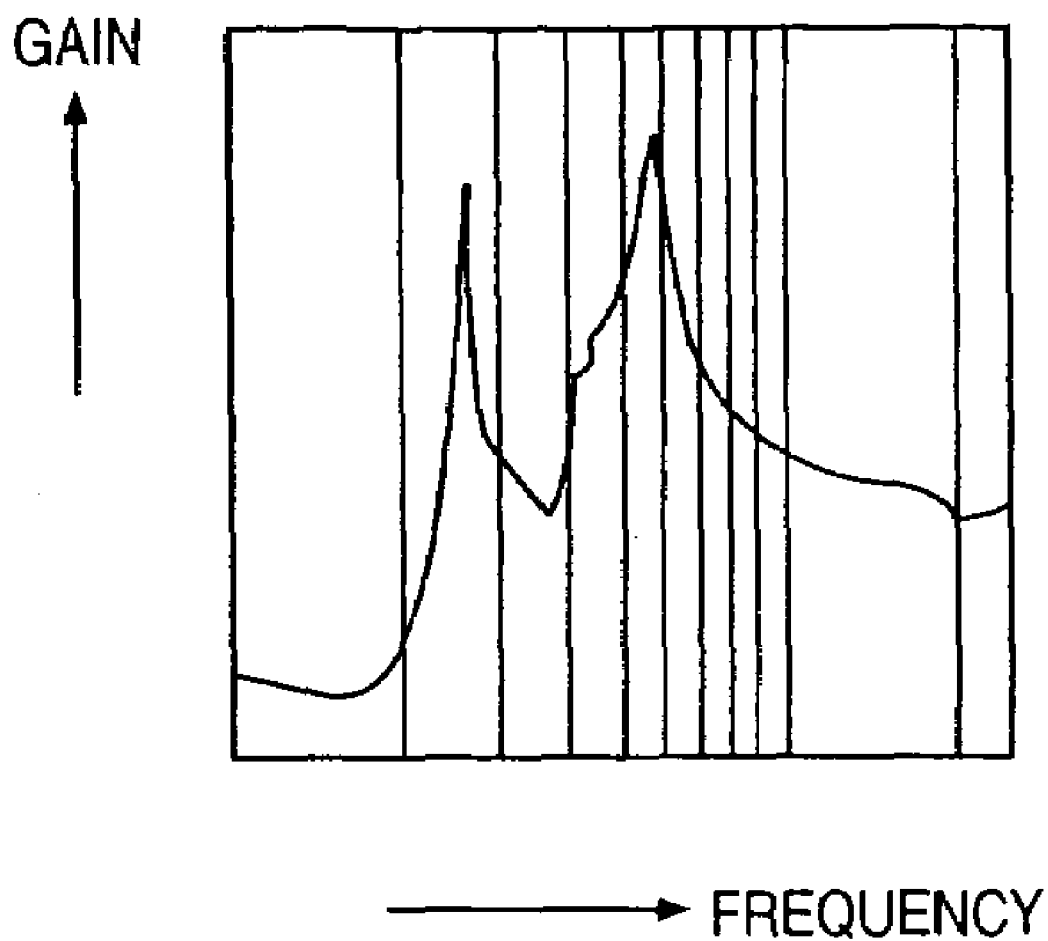
FIG. 8 is a graph showing a frequency response (inertance) measured upon a vibrating operation using an M-sequence.

(1) Frequency Response in Characteristic Detection:

FIG. 7 shows the frequency response of a given active mount 4 of an anti-vibration table 2, which is acquired by using a servo analyzer. FIG. 8 shows the frequency response of the same mount, which is obtained in a short period of time by vibrating the anti-vibration table 2 in accordance with M-sequence signals in the apparatus arrangement shown in FIG. 1 or 5. It is confirmed with reference to a conventional measurement result that almost similar frequency characteristics are obtained. However, measurement using the M-sequence signals can be performed in a shorter period of time. Obviously, since the precision in measurement performed by a short-time vibrating operation is nearly equal to that in the conventional measurement, measurement of a frequency response by the semiconductor exposure apparatus having the system identification function shown in FIG. 1 or FIG. 5 is superior to the conventional measurement.

Figure 9:
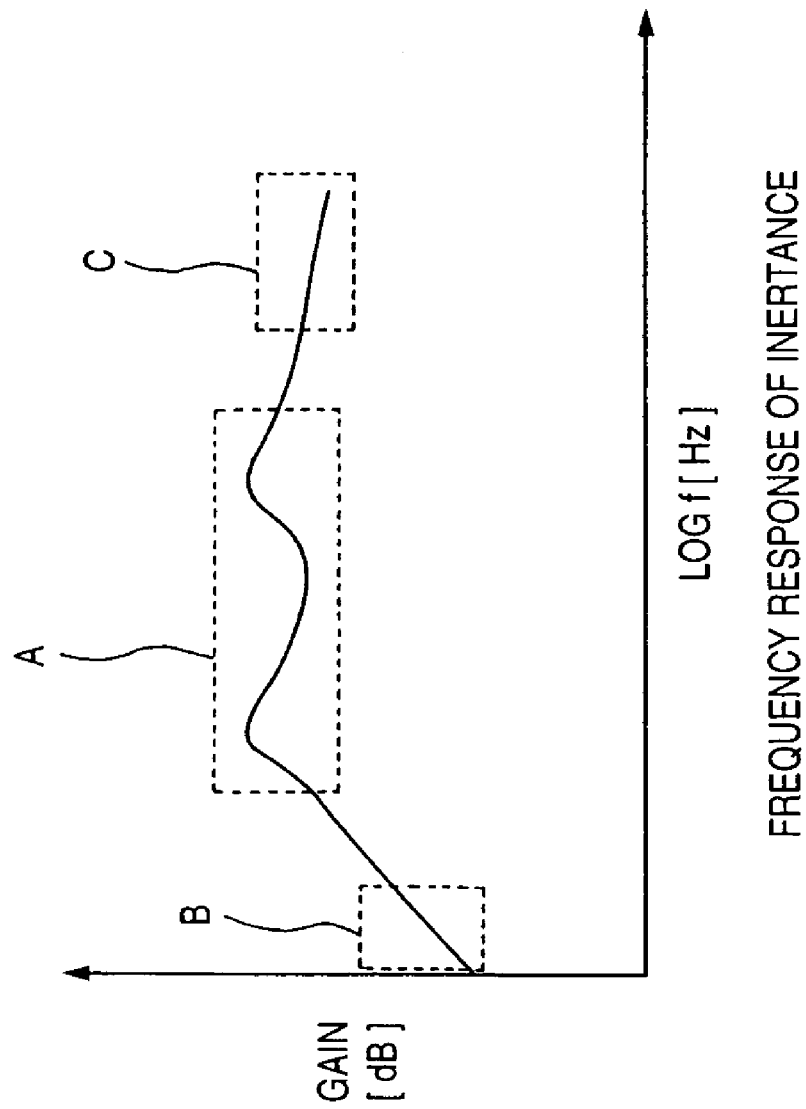
FIG. 9 is a graph showing a frequency response as an interance.

A frequency response can be used for fault analysis. The active anti-vibration apparatus is vibrated by using M-sequence signals to obtain a frequency response from a driving force to an acceleration signal. This is a response characteristic known as an inertance or accelerance. FIG. 9 schematically shows the shape of this characteristic. Referring to FIG. 9, the peak of the portion enclosed with a dotted line A is a resonance frequency, which is the natural frequency of the translation/rotation motion of the anti-vibration table. This frequency and a peak amount (damping ratio) are important parameters that control the movement of the anti-vibration table. Such a parameter can be used as follows. A control limit may be set to detect a phenomenon in which the peak amount increases. Upon detection of such a phenomenon, a trigger signal is activated to generate a warning or forcibly stop the apparatus in the worst case. The characteristic of the low-frequency portion enclosed with a dotted line B allows detection of a mechanical collision between the anti-vibration table and a mechanical member on the fixed side.

The characteristic of the high-frequency portion enclosed with a dotted line C allows detection of a slight collision with the anti-vibration table. By grasping the characteristics of a frequency response, the state of the apparatus can be diagnosed.

Obviously, a characteristic used for diagnosis is not limited to an inertance response.

For example, a compliance or mobility can be used. The closed loop frequency response of the active anti-vibration apparatus can also be used. Alternatively, a real waveform obtained by a vibrating operation may be compared with a waveform in the apparatus during normal operation to perform fault diagnosis, and the same operation can be performed by spectrum analysis of the real waveform.

(2) Physical Parameter in Characteristic Detection:

In general, the motion equation of a rigid body can be expressed as $$M\ddot{X}+C\dot{X}+KX=F \qquad (1)$$

where M is the mass matrix, C is the viscous damping matrix, K is the rigidity matrix, F is the driving force vector, X is the displacement vector, and "•" indicates time differentiation.

The above equation is a translation/rotation mode equation associated with the center of gravity of a rigid body. As for a motion mechanism supported by the active anti-vibration apparatus, in practice, actuators and sensors are spatially distributed. In consideration of the geometrical arrangement of these components and equation (1), therefore, coefficient elements constituting M, C and K matrices can be acquired from a series of measurement results. In the first embodiment, measurement data is obtained by simultaneously activating the respective actuators, or a set of measurement data corresponding to the number of actuators is acquired by independently activating the actuators. In consideration of the position coordinates of the sensors and actuators from which the measurement data are collected, the measurement data can be converted into data in the form expressed by the above equation by dividing them according to the vibration modes of translation/rotation in the X, Y, and Z directions. When the apparatus arrangement shown in FIG. 5 is used, a vibrating operation is performed in each motion mode, and M, C, and K can be directly calculated by using equation (1). By postulating the existence of several known physical parameters, therefore, M, C, and K values can be calculated. Specific portions of the motion mechanism in which variations are caused can be known by comparing the M, C, and K values obtained by applying this calculation method to a plurality of apparatuses. If such variations can be detected, control criteria, and the like, in a manufacturing process can be quantitatively determined depending on which tolerances should be strict in parts working and assembly processes for a motion mechanism.

(3) Integration Design:

In the prior art, after the mechanism design is complete, a control apparatus is designed on the basis of the mechanism. To meet demands for reduction in development period and cost, it becomes necessary to perform mechanism design and control design at once. Both the motion mechanism and the control apparatus are combined in a computer, and design and improvements of them are simulated. Only when predetermined performance requirements are satisfied, is a product manufactured. A major premise for this operation is that there is a motion mechanism model that can express the phenomenon of an actual product. Obviously, a mathematical model obtained by a system identification unit 14 in the semiconductor exposure apparatus having the system identification function in this embodiment can be used as a mathematical model in performing integration design.

(4) Vibration Estimation in A Portion Where Detection is Impossible:

When an X-Y stage 3 moves in a step-and-repeat or step-and-scan operation, it vibrates the projection optical system which is the most important component of the semiconductor exposure apparatus. This greatly affects the printing of an IC. To improve this, first of all, the vibration level of this unit must be detected in advance. However, for example, an acceleration sensor is not allowed to be attached to a lens of the projection optical system to measure vibrations. In addition to the lenses of the projection optical system, measurement devices such as acceleration sensors for measurement cannot be attached to other important units placed in narrow portions. In such a case, the arrangement of the semiconductor exposure apparatus having the system identification function of this embodiment exerts its effect. Various measurement outputs other than output signals from the sensors of the active anti-vibration apparatus in FIG. 1 or FIG. 5 can be input to the data storage unit 12. Therefore, the transfer characteristics among various sensors spatially distributed in the semiconductor exposure apparatus can be grasped. If the interrelationship between the spatially distributed portions is known, the transfer characteristics of portions where no sensor can be placed can be estimated. For example, the vibration level of the lens center of the projection optical system can be easily estimated.

The characteristic extraction/diagnosis unit 15 also has the function of estimating the vibration level (physical information) of a portion, where direct measurement is impossible, in consideration of data in the data storage unit and the portions in the semiconductor exposure apparatus from which the data are acquired.

As described above, according to the present invention, (1) the characteristics of the motion mechanism which can be acquired by vibrating operation using pseudo-random signals (M-sequences) are high in precision, and hence can be effectively used as data for design and maintenance. The acquired data are analyzed and evaluated for self-diagnosis to allow the performance of the apparatus to be maintained at a predetermined level. By preparing a means for generating such signals in the apparatus, analysis and evaluation can be performed under uniform vibrating conditions.

(2) Since pseudo-random signals (M-sequences) can be input within a very short period of time, the motion mechanism is free from an excessive load unlike in a vibrating operation using sine waves.

(3) Self-diagnosis of the motion mechanism can be performed in a short period of time without stopping the semiconductor manufacturing apparatus. Therefore, maintenance can be executed at a proper timing without decreasing the productivity.

Fifth Embodiment

Figure 12:
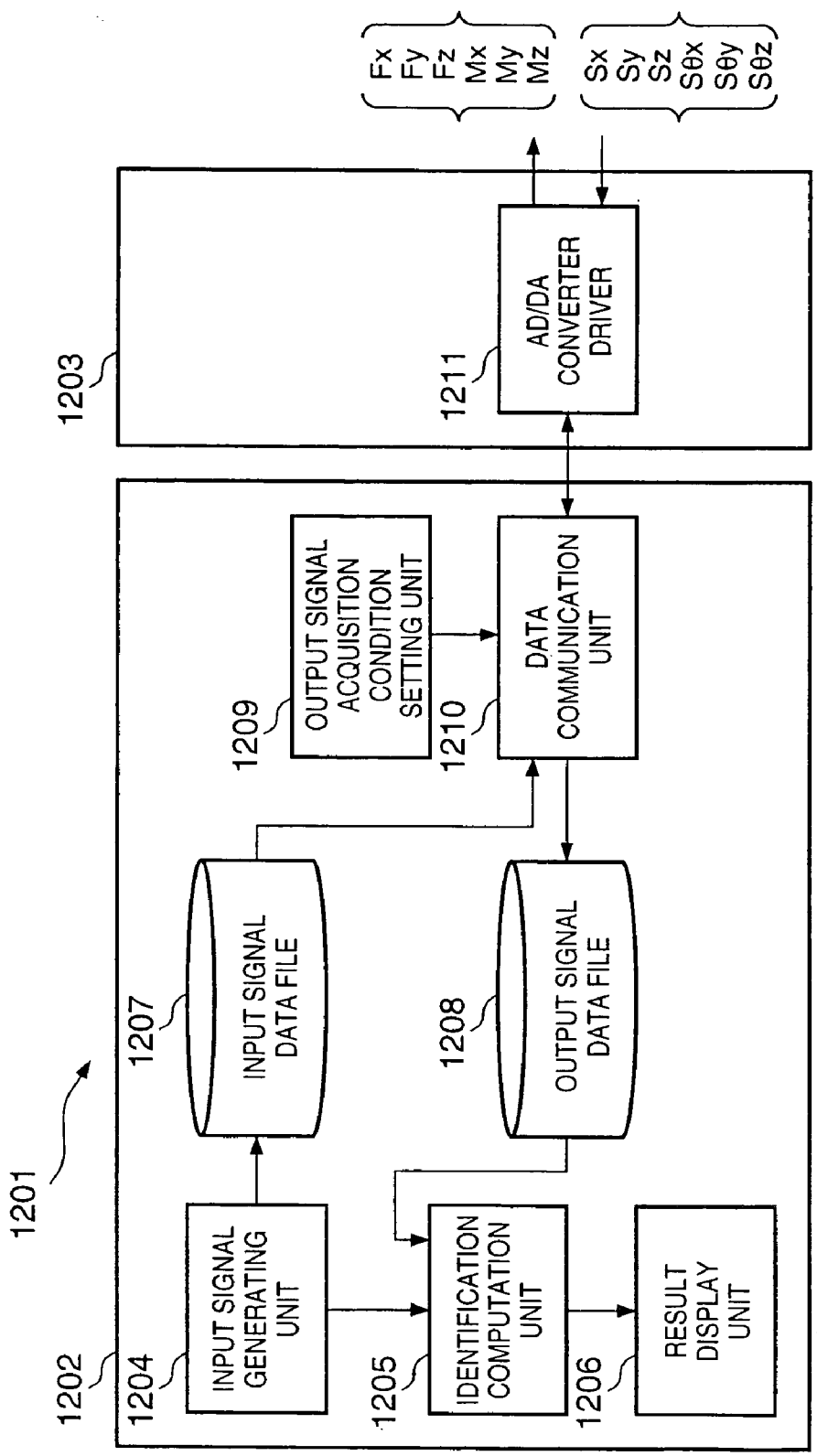
FIG. 12 is a block diagram showing an arrangement for performing display processing for identification results in a system identification apparatus.
Figure 14:
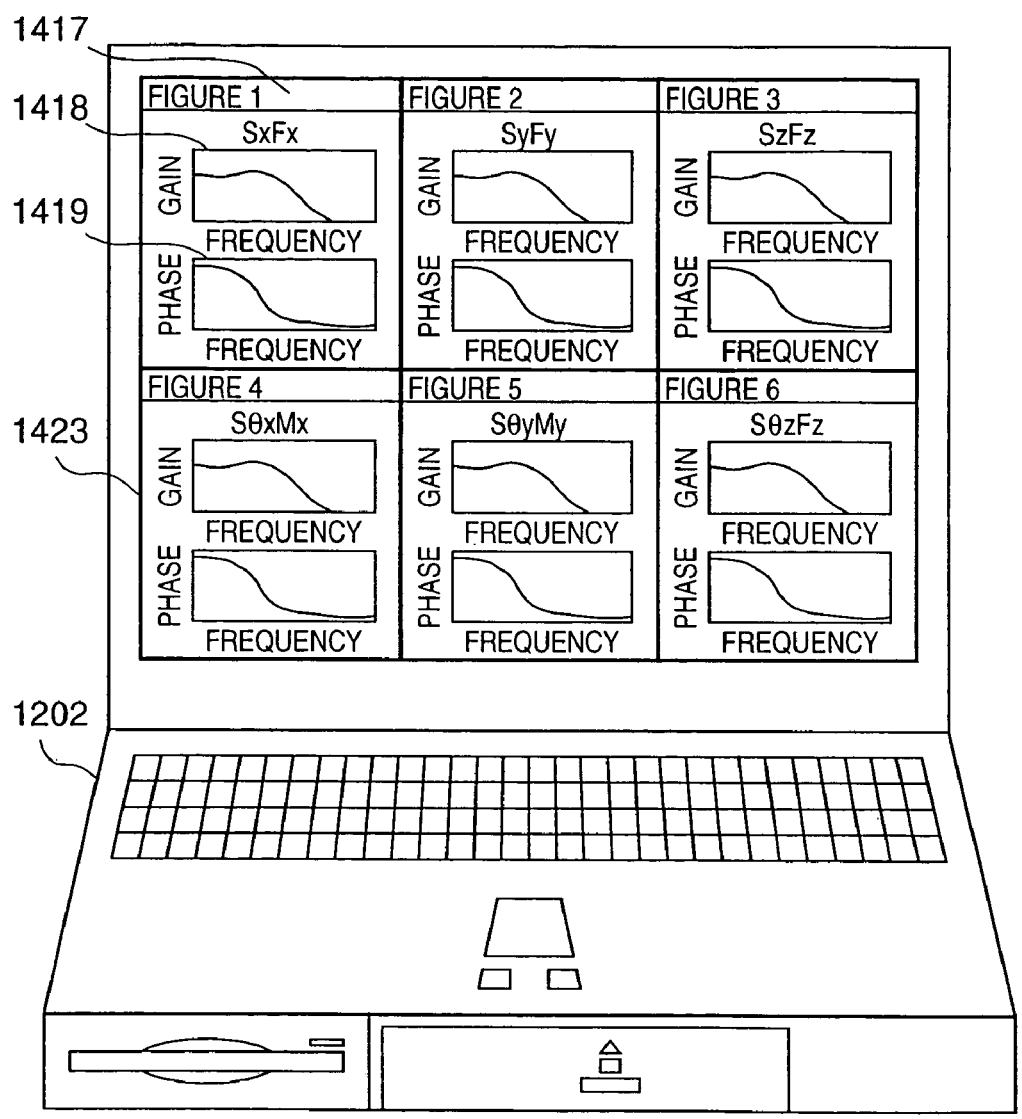
FIG. 14 is a perspective view showing a display example of identification results.

This embodiment is related to the arrangement of a practical identification apparatus for identifying the characteristics of a motion mechanism. An embodiment of an anti-vibration apparatus will be described in detail with reference to the accompanying drawings. As shown in FIG. 12, a system identification apparatus 1201 is comprised of a computer 1202 for performing arithmetic processing and an AD/DA converter 1203 for converting an analog signal into a digital signal and vice versa. The computer 1202 mainly performs an identification computation for identifying the characteristics of a motion mechanism as an identification target (or a motion mechanism system as an identification target, which will be generically called a target system in the following embodiments), and displays the identification results on a display screen 1423 (FIG. 14).

The AD/DA converter 1203 converts a digital input signal to be applied to an identification target into an analog input signal, and also converts an analog output signal from the identification target into a digital output signal. With this operation, even if the identification target is a continuous system, and analog signals are used as input and output signals, these signals can be converted into digital signals and used for a computation.

The arrangement and operation of the system identification apparatus 1201 will be described in more detail below. The computer 1202 of the system identification apparatus 1201 shown in FIG. 12 performs the following processing. An input signal generating unit 1201 generates an input signal to be applied to an identification target. The input signal generated by the input signal generating unit 1204 is a white signal, a pseudo-white signal binary signal, or an M-sequence signal. The input signal generating unit 1204 records this input signal on an input signal data file 1207. A data communication unit 1210 transmits the input signal, which is recorded on the input signal data file 1207 and to be applied to the identification target, to the AD/DA converter 1203. An output signal acquisition condition setting unit 1209 sets acquisition conditions for output signals from the identification target. The data communication unit 1210 receives output signals based on the identification target from the AD/DA converter 1203 in accordance with the conditions set by the output signal acquisition condition setting unit 1209, and records the signals on an output signal data file 1208. An identification computation unit 1205 performs a computation to identify the characteristics of the identification target in accordance with the input signals from the input signal generating unit 1204 and the output signals recorded on the output signal data file 1208. A result display unit 1206 displays the identification results.

In the AD/DA converter 1203 of the system identification apparatus 1201, an AD/DA converter driver 1211 receives digital input signals from the data communication unit 1210 of the computer 1202, converts them into analog input signals, and applies the signals to an identification target. The AD/DA converter driver 1211 also converts analog output signals generated in this identification target into digital output signals and transmits them to the data communication unit 1210 of the computer 1202.

Figure 13:
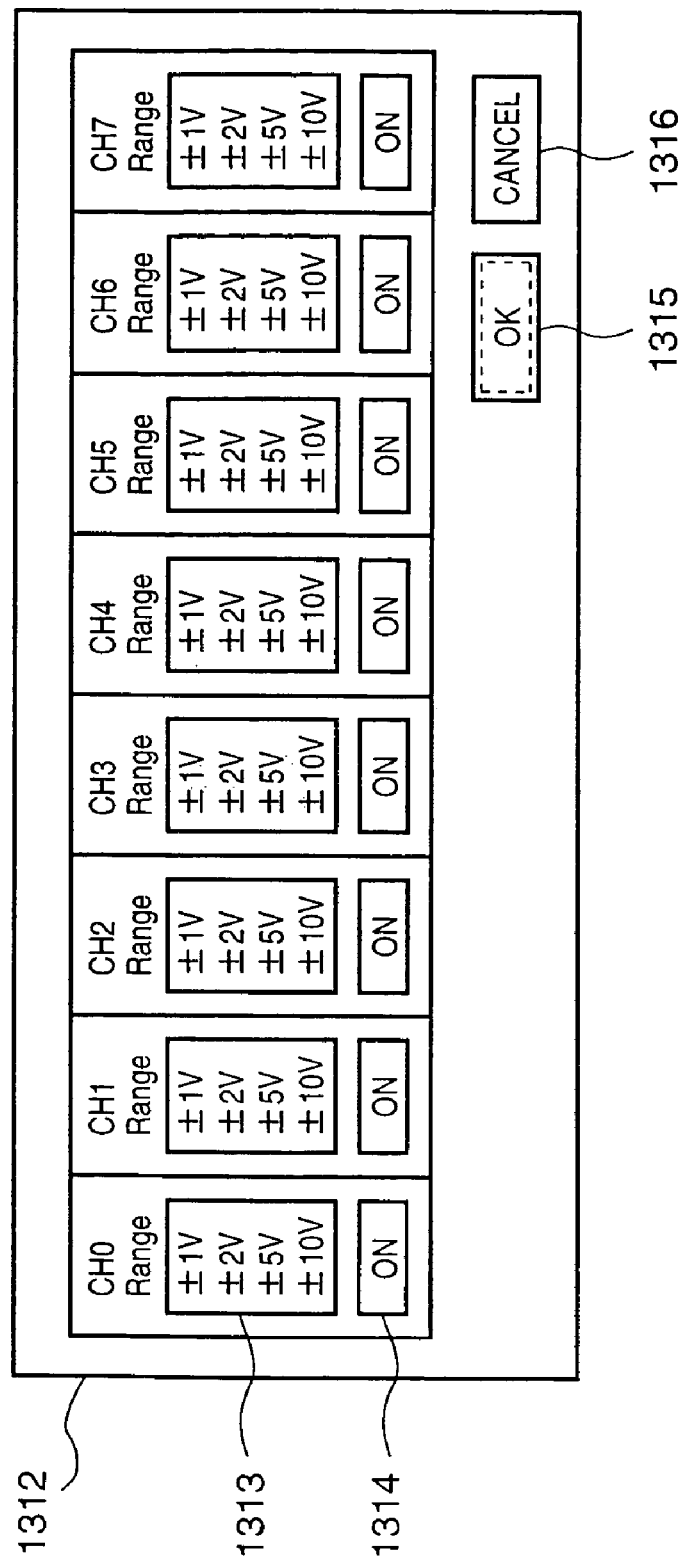
FIG. 13 is a view showing the arrangement of a condition setting window.

The output signal acquisition condition setting unit 1209 displays a condition setting window 1312 on the display screen 1423 to allow the operator to arbitrarily choose between permission and inhibition of signal acquisition and set signal ranges, as shown in FIG. 13. FIG. 13 shows a display example, which shows settings for acquisition of signals through a total of eight channels from channel CH0 to channel CH7. In this case, signals are to be acquired through a total of six channels from channel CH0 to channel CH5. The operator can set permission/inhibition of acquisition of output signals assigned to the respective channels with signal acquisition selectors 1314. In the case shown in FIG. 13, since the signal acquisition selectors 1314 corresponding to channels CH0 to CH5 are set in the ON stage, the output signals assigned to these channels are acquired. Since the signal acquisition selectors 1314 corresponding to channels CH6 and CH7 are set in the OFF state, the output signals assigned to these channels are not acquired.

The operator can also switch a signal acquisition range in four steps, i.e. ±1 V, ±2 V, ±5 V, and ±10 V with a signal range selector 1313. By switching the signal acquisition ranges in accordance with the amplitudes or ranges of output signals to be acquired, the output signals based on the identification target can be acquired with high precision without being influenced by a noise level.

Upon reception of the identification results from the identification computation unit 1205, the result display unit 1206 displays identification result display windows 1417 on the display screen 1423, as shown in FIG. 14. Each identification result display window 1417 displays both or one of a gain diagram 1418 and a phase diagram 1419. By displaying such frequency characteristics, the characteristics of the identification target can be clearly displayed. Referring to FIG. 14, each identification result display window 1417 displays both a gain diagram and a phase diagram as frequency characteristic diagrams. However, the identification results displayed on the identification result display windows 1417 may be pole-zero assignments, differential equations, difference equations, resonance frequencies, damping coefficients, and the like.

The identification result display windows 1417 are displayed on the entire display screen 1423, as shown in FIG. 14. This allows the identification results to be displayed with good visibility. The operator can therefore clearly recognize the identification results.

Figure 17:
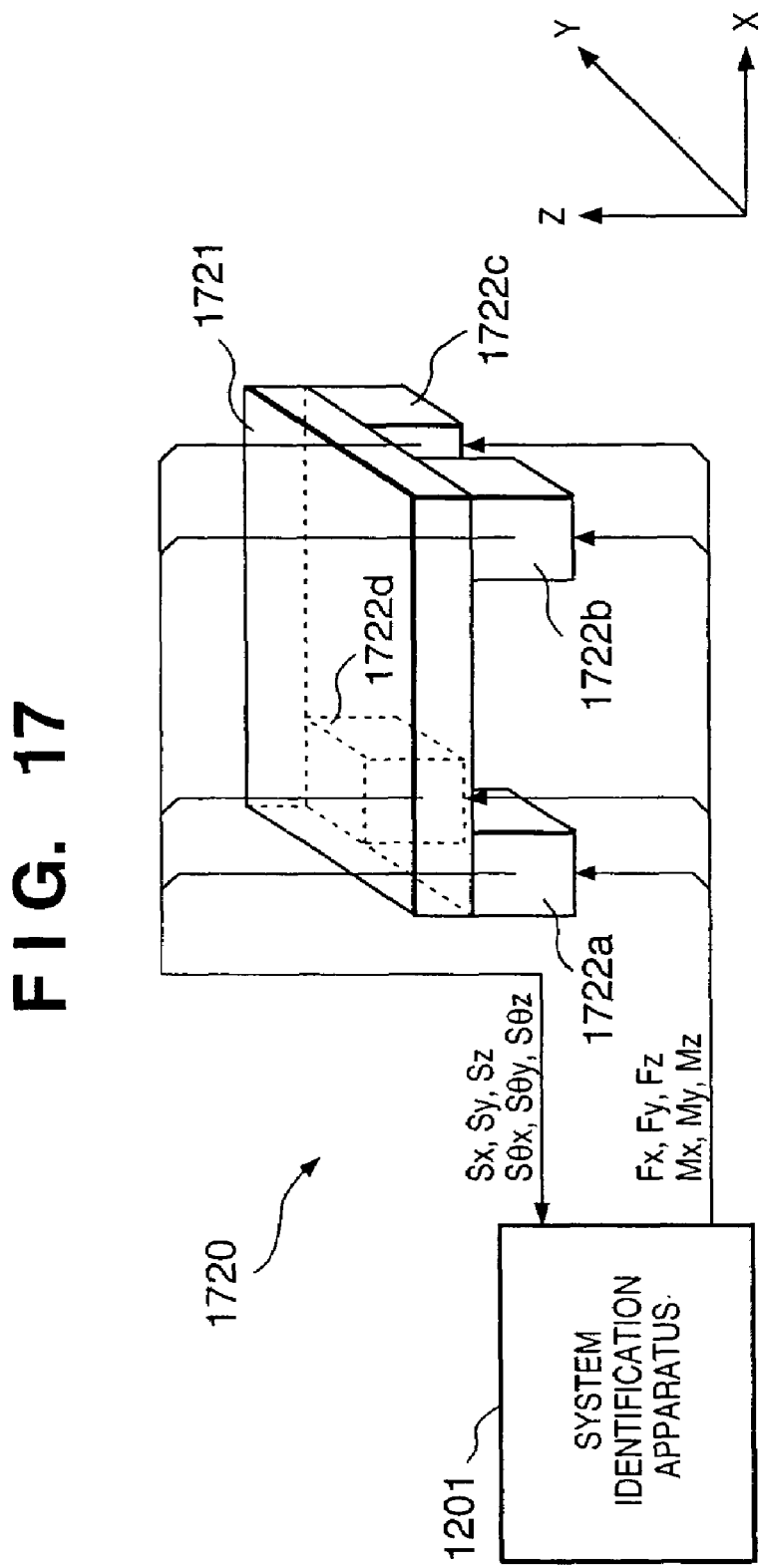
FIG. 17 is a perspective view showing signals to be applied by the identification apparatus to identify an active anti-vibration apparatus and signals to be received.

The system identification apparatus 1201 for identifying the characteristics of an anti-vibration apparatus 1720 will be described next. As shown in FIG. 17, the anti-vibration apparatus 1720 is comprised of an anti-vibration table 1721, mount units 1722a, 1722b, 1722c, and 1722d for supporting the four corners of the anti-vibration apparatus 1720, actuators for exerting control forces on the anti-vibration table 1721, and vibration sensors for detecting the vibrations of the anti-vibration table 1721 (the actuators and the vibration sensors are not shown in FIG. 17). The anti-vibration apparatus 1720 performs vibration control to quickly damp the vibrations produced in the anti-vibration table 1721. The vibrations produced in the anti-vibration table 1721 can be decomposed into six modes, namely translation in the X-axis direction, translation in the Y-axis direction, translation in the Z-axis direction, rotation about the X-axis, rotation about the Y-axis, and rotation about the Z-axis with reference to the XYZ coordinate system. The characteristics of the anti-vibration apparatus 1720 as an identification target can be expressed by vibrations in these six modes. The system identification apparatus 1201 applies input signals to the actuators. The actuators driven on the basis of these signals vibrate the anti-vibration table 1721. At this time, the vibrations produced in the anti-vibration table 1721 are detected by the vibration sensors. The system identification apparatus 1201 acquires output signals from the vibration sensors and identifies the characteristics of the system identification apparatus 1201 in accordance with these input and output signals. The input signals applied to the actuators are based on six modes, namely translation $F_x$ in the X-axis direction, translation $F_y$ in the Y-axis direction, translation $F_z$ in the Z-axis direction, rotation $M_x$ about the X-axis, rotation $M_y$ about the Y-axis, and rotation $M_z$ about the Z-axis. The output signals acquired from the vibration sensors are based on six modes, namely translation $S_x$ in the X-axis direction, translation $S_y$ in the Y-axis direction, translation $S_z$ in the Z-axis direction, rotation $S_{\theta x}$ about the X-axis, rotation $S_{\theta y}$ about the Y-axis, and rotation $S_{\theta z}$ about the Z-axis. These signals are transmitted and received through the AD/DA converter driver 1211 (FIG. 12).

FIG. 14 shows a display of the processing result obtained by the system identification apparatus 1201 that has identified the characteristics of the anti-vibration apparatus 1720. The identification result display windows 1417 display the identification results of a total of six modes, i.e., three-degrees-of-freedom of translation and three-degrees-of-freedom of rotation, as the gain diagrams 1418 and the phase diagrams 1419.

That is, the identification results of the six modes are displayed on the identification result display windows 1417 in accordance with an output signal $S_x$ based on an input signal $F_x$ representing translation in the X-axis direction, an output signal Sy based on an input signal $F_y$ representing translation in the Y-axis direction, an output signal $S_z$ based on an input signal $F_x$ representing translation in the Z-axis direction, an output signal $S_{\theta x}$ based on an input signal $M_x$ representing rotation about the X-axis, an output signal $S_{\theta y}$ based on an input signal $M_y$ representing rotation about the Y-axis, and an output signal $S_{\theta z}$ based on an input signal $M_z$ representing rotation about the Z-axis.

For example, "$S_x F_x$" is attached to the displays 1418 and 1419 of the input signal $F_x$ and the corresponding output signal $S_x$, which represents translation in the X-axis direction to clarify the input and output signals, thereby discriminating and displaying the six modes. According to this display layout, three modes, i.e., translation in the X-axis direction, translation in the Y-axis direction, and translation in the Z-axis direction, are sequentially arranged from the left of the upper portion of the display screen 1423 in the order named, and three modes, i.e., rotation about the X-axis, rotation about the Y-axis, and rotation about the Z-axis, are sequentially arranged from the left of the lower portion of the display screen 1423 in the order named. By laying out the translation and rotation identification results vertically while matching the coordinate systems with each other, the operator can clearly recognize the characteristics of the anti-vibration apparatus 1720.

Referring to FIG. 14, the display screen 1423 is divided into upper and lower portions according to the motion modes of translation and rotation. However, the display screen 1423 may be divided into right and left portions. In this case, the motion modes of translation in the X-axis direction or rotation about the X-axis, translation in the Y-axis direction or rotation about the Y-axis, and translation in the Z-axis direction or rotation about the Z-axis are sequentially displayed from the upper position on each of the right and left portions of the display screen 1423 in the order named. This display method also allows the characteristics of the anti-vibration apparatus 1720 to be displayed in order on the six identification result display windows 1417 on the display screen. The operator can, therefore, clearly recognize the characteristics of the anti-vibration apparatus 1720.

Figure 15:
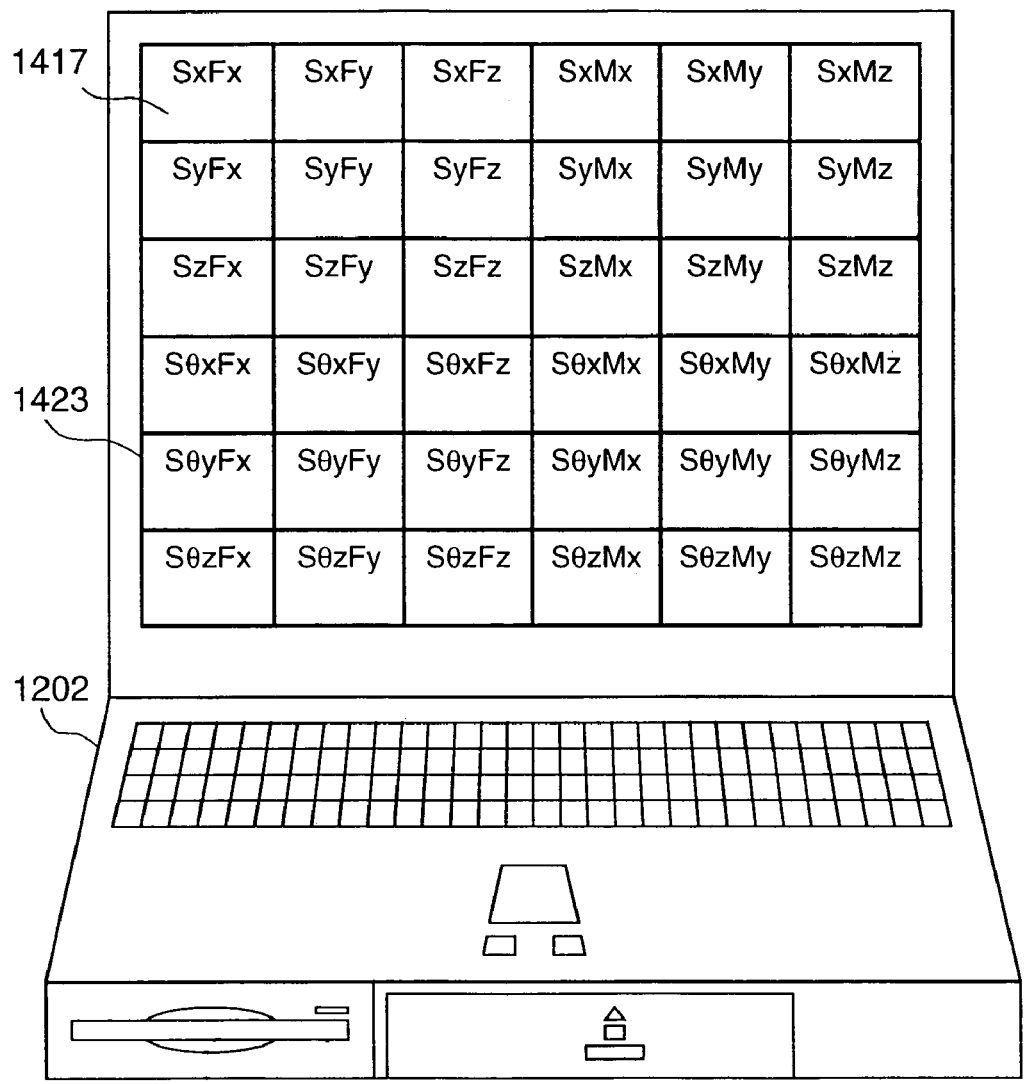
FIG. 15 is a perspective view showing how the screen is divided in units of elements corresponding to identification results to display the identification results in detail.
Figure 16:
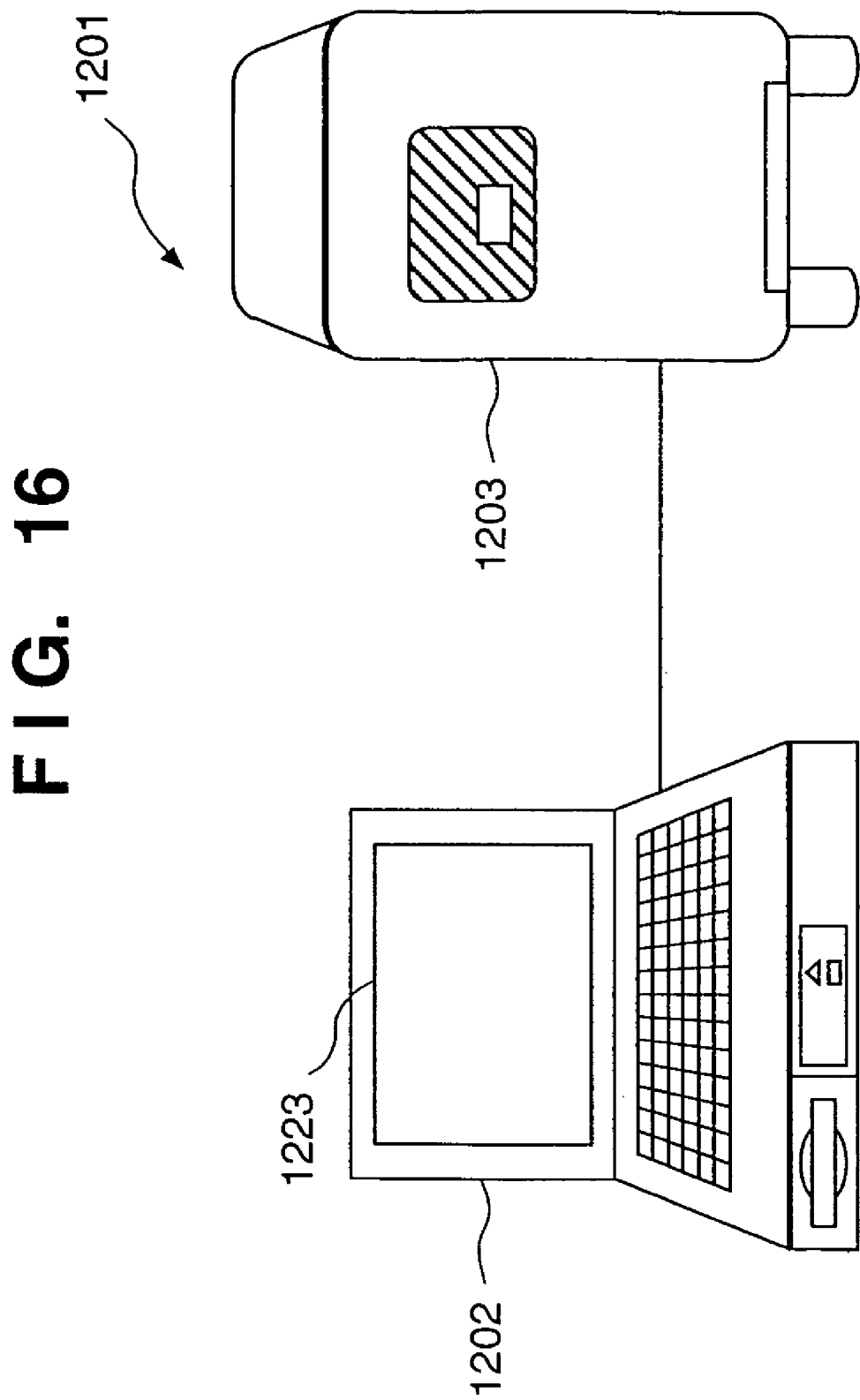
FIG. 16 is a perspective view showing the outer appearance of an identification apparatus.

FIG. 15 shows a display of the processing result obtained by the system identification apparatus 1201 in a case wherein the characteristics of the anti-vibration apparatus 1720 are displayed in more detail. In the case shown in FIG. 14, for example, an output signal in the X-axis direction is displayed in correspondence with an input signal in the X-axis direction. In this manner, the input and output coordinates systems match with each other (which corresponds to diagonal elements when expressed as a motion equation of a multi-degree-of-freedom system). In the case shown in FIG. 15, output signals in the Y-axis and Z-axis directions (corresponding to non-diagonal elements when expressed as a motion equation of a multi-degree-of-freedom system) are displayed, in addition to an output in the X-axis direction which excites an input signal in the X-axis direction, thus displaying information in more detail.

Since input signals and output signals for the anti-vibration apparatus 1720 are based on the six modes, as described above, the input signals of the six modes and the output signals of the six modes are combined with each other, and the characteristics of the anti-vibration apparatus 1720 are defined by a total of thirty-six pieces of vibration mode information. Referring to FIG. 15, the display screen 1423 is divided into six portions both in the vertical and horizontal directions, thereby displaying thirty-six identification result display windows 1417.

For example, "$S_x F_x$" explicitly indicates the output signal $S_x$ representing translation in the X-axis direction when it corresponds to the input signal $F_x$ representing translation in the X-axis direction, and "$S_y F_x$" explicitly indicates the output signal $S_y$ representing translation in the Y-axis direction when it corresponds to the input signal $F_x$ representing translation in the X-axis direction, thereby allowing the operator to clearly recognize the input/output relationship between data.

As described above, according to the system identification apparatus and method according to this embodiment, the computer and the AD/DA converter are used to allow the operator to set a signal acquisition range in accordance with outputs based on a plant or the like. In addition, identification results can be displayed to allow the operator to easily recognize the characteristics of a plant or the like.

Sixth Embodiment

Figure 18:
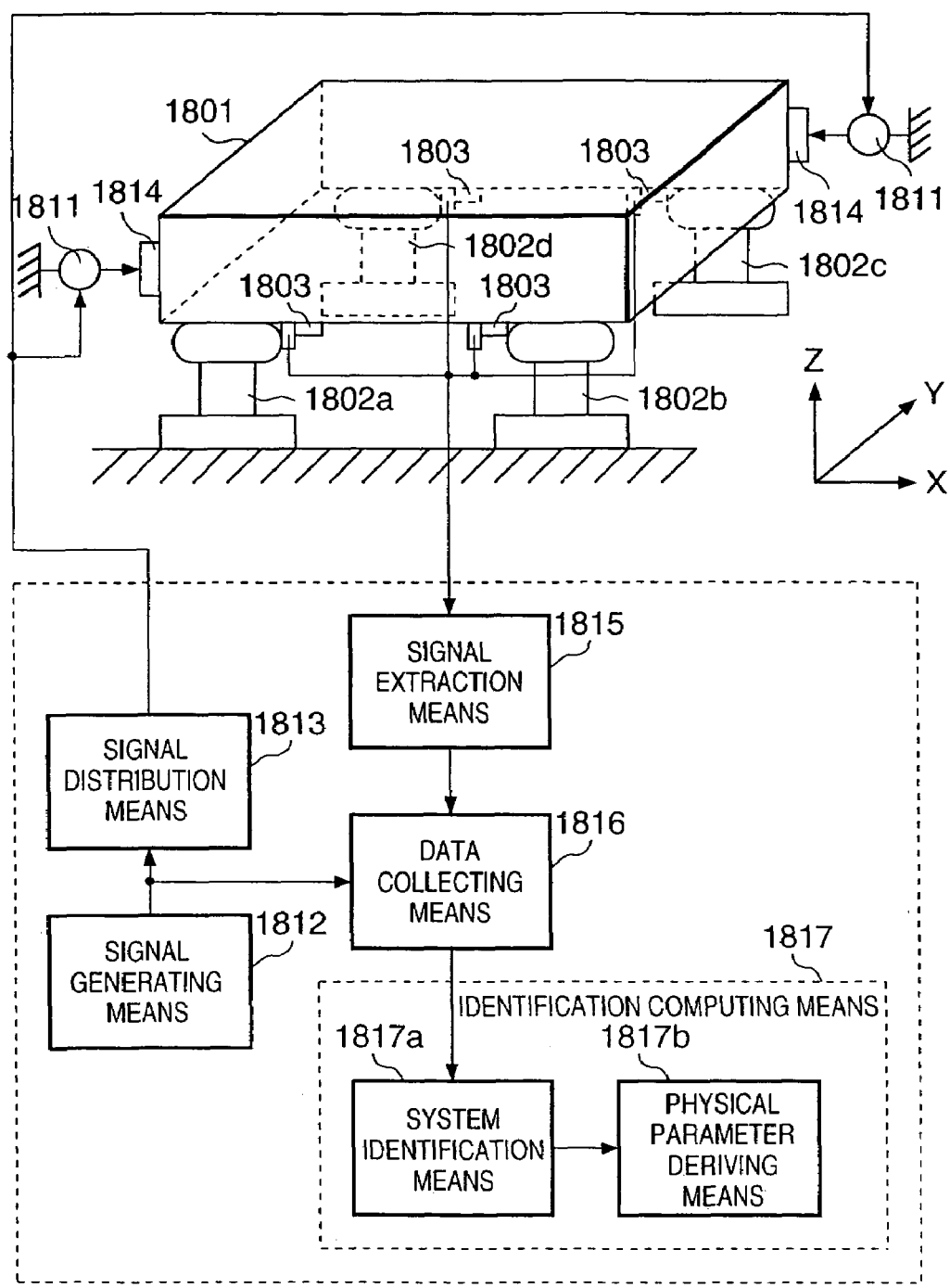
FIG. 18 is a view showing an arrangement for deriving physical parameters in the system identification apparatus.

FIG. 18 shows an arrangement for acquiring physical parameters in a system identification apparatus. An anti-vibration table 1801 on which an exposure apparatus or the like is mounted is supported by four active anti-vibration apparatuses 1802a, 1802b, 1802c, and 1802d. The support units 1802a, 1802b, 1802c, and 1802d of the active anti-vibration apparatuses have anti-vibration support means such as air springs disposed in the vertical and horizontal directions. With this arrangement, the apparatus main body is supported. Although the apparatus having the anti-vibration table 1801 damped/supported by the active anti-vibration apparatuses 1802 at four points as shown in FIG. 18 will be described below as an example, the apparatus and method disclosed by the present invention are not limited to this example. Obviously, the present invention can be applied to general motion mechanisms of six-degrees-of-freedom, e.g., an apparatus designed to be supported at three points, and the application of this apparatus and method to such apparatuses are incorporated in the present invention.

Figure 19:
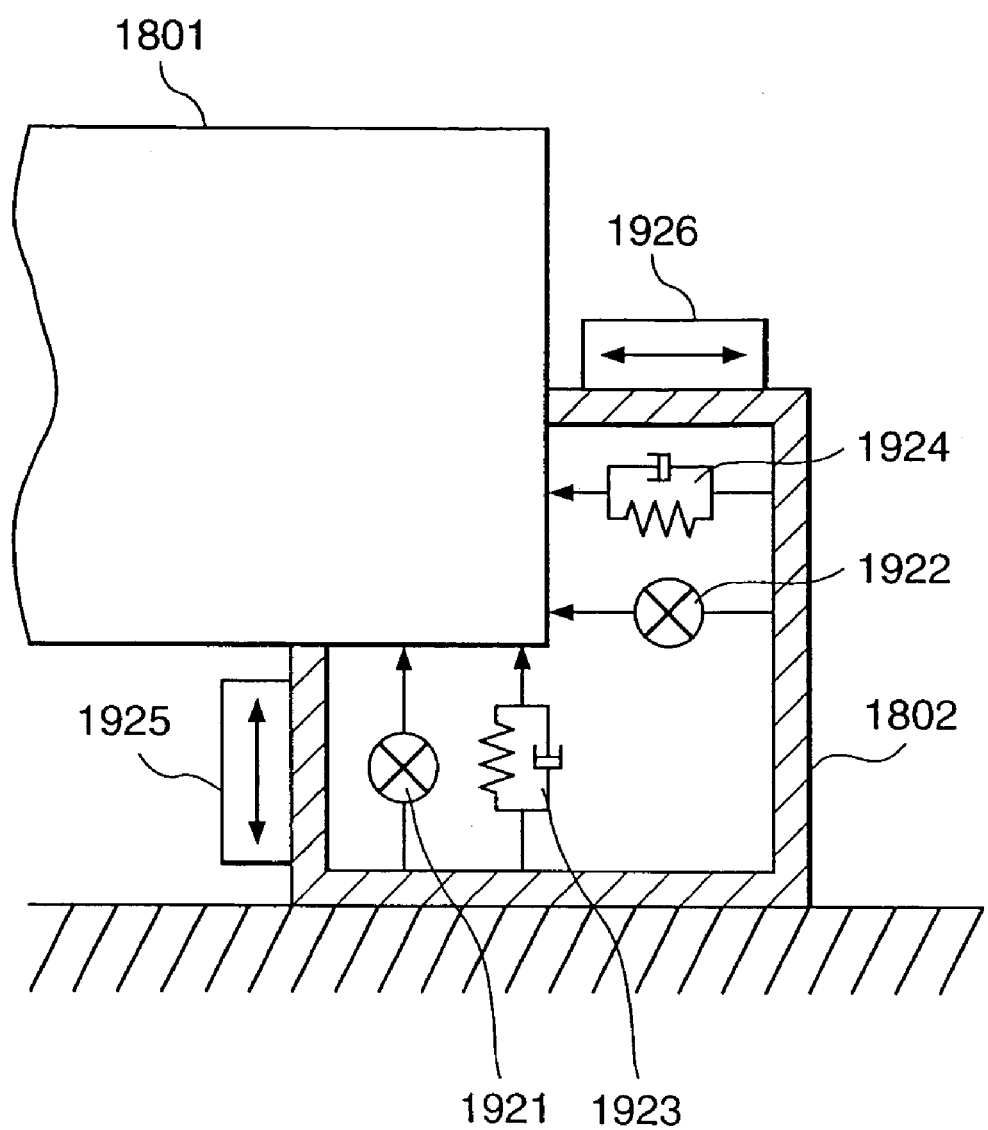
FIG. 19 is a view showing the structure of an active anti-vibration apparatus as an example of a target motion mechanism.

FIG. 19 is a view for explaining the structure of each active anti-vibration apparatus in more detail. Each of the active anti-vibration apparatuses 1802a, 1802b, 1802c, and 1802d includes a vertical actuator 1921 for applying a control force to the anti-vibration table 1801 in the vertical direction, a horizontal actuator 1922 for applying a control force to the anti-vibration table 1801 in the horizontal direction, a vertical support means 1923 for damping/supporting the anti-vibration table 1801 in the vertical direction, a horizontal support means 1924 for damping/supporting the anti-vibration table 1801 in the horizontal direction, and vertical and horizontal vibration sensors 1925 and 1926 which are mounted on the anti-vibration table 1801 or members rigidly coupled thereto to respectively detect vertical and horizontal vibrations of the anti-vibration table 1801.

As the vertical actuator 1921 and the horizontal actuator 1922, electromagnetic actuators such as linear motors, pneumatic actuators designed to control the internal pressure of air springs by valves for adjusting the supply/discharge of air to/from the air springs, or combinations of these actuators can be used. If the above pneumatic actuators using the air springs are used as the vertical actuator 1921 and the horizontal actuator 1922, the actuators can also serve as the vertical support means 1923 and the horizontal support means 1924.

As the vertical vibration sensor 1925 and the horizontal vibration sensor 1926, acceleration sensors for detecting the vibrations of the anti-vibration table 1801 as accelerations can be suitably used.

The active anti-vibration apparatus 1802 (a representative of the active anti-vibration apparatuses 1802a, 1802b, 1802c, and 1802d in FIG. 18) inputs vibration detection signals obtained from the anti-vibration table 1801 by the vertical vibration sensor 1925 and horizontal vibration sensor 1926 to a control computation means (not shown) to perform a compensation operation for the signals, and controls the vertical actuator 1921 and the horizontal actuator 1922 on the basis of the resultant signals, thereby actively controlling the vibrations of the apparatus.

Each of the active anti-vibration apparatuses 1802a, 1802b, 1802c, and 1802d may independently form a control loop to perform a control computation, or the respective active anti-vibration apparatuses 1802a, 1802b, 1802c, and 1802d may perform a control computation to control vibrations in each motion behavior, e.g., translation or rotation, of the overall anti-vibration table 1801.

A motion mechanism as an identification target may be defined as a six-degree-of-freedom rigid motion mechanism having the following degrees-of-freedom of motion: two-degrees-of-freedom (X, Y) of translation in the horizontal direction, one-degree-of-freedom (Z) of translation in the vertical direction, and three-degrees-of-freedom ($\theta_x$, $\theta_y$, $\theta_z$) about the X-, Y-, and Z-axes. A procedure and apparatus for identifying the mass, moment of inertia, and product of inertia of the anti-vibration table 1801 in this six-degree-of-freedom motion mechanism and the spring constant and viscous damping coefficient of the anti-vibration support means of the active anti-vibration apparatus 1802 will be described below.

FIG. 20 schematically shows the six-degree-of-freedom motion mechanism as a mechanical model, which is constituted by the anti-vibration table 1801 and the active anti-vibration apparatuses 1802a, 1802b, 1802c, and 1802d for damping/supporting the anti-vibration table 1801 and has motion modes of three-degrees-of-freedom of translation and three-degrees-of-freedom of rotation.

As shown in FIG. 18, to identify the characteristics of the six-degree-of-freedom motion mechanism, the identification apparatus disclosed in the present invention includes a plurality of vibrating means 1811 for vibrating the anti-vibration table 1801, a signal generating means 1812 for generating vibration input signals to be applied to the vibrating means 1811, a signal distribution means 1813 serving as a first auxiliary computation means for distributing the signals from the signal generating means 1812 to the respective vibrating means 1811, force sensors 1814 for measuring the control forces applied from the vibrating means 1811 to the anti-vibration table 1801, a plurality of vibration sensors 1803 for measuring the motion behavior of the anti-vibration table 1801, a signal extraction means 1815 serving as a second auxiliary computation means for extracting desired signals from outputs from the vibration sensors 1803, a data collecting means 1816 for collecting output time-series data from the signal generating means 1812 and the signal extraction means 1815, and an identification computing means 1817 for identifying the characteristics and physical parameters of a motion mechanism as a target.

The identification computing means 1817 is comprised of a system identification means 1817a for deriving a mathematical model representing the input/output characteristics of the motion mechanism with the motion state of the motion mechanism being an output on the basis of the time-series data recorded on the data collecting means 1816, and a physical parameter deriving means 1817b for deriving the physical characteristic values of mechanical and electrical elements constituting the motion mechanism on the basis of the mathematical model.

Referring to FIG. 18, the two vibrating means 1811 are disposed in one horizontal direction. However, three or more vibrating means in the vertical direction and three or more vibrating means in the horizontal direction, i.e., a total of six or more vibrating means, are preferably disposed to independently excite vibrations of all the degrees-of-freedom of motions of the six-degree-of-freedom motion mechanism.

As the vibrating means 1811, the vertical actuators 1921 and the horizontal actuators 1922 described above can be used. As the vibration sensors 1803, acceleration sensors can be used. As the vibrating means 1811, electromagnetic actuators such as linear motors can also be used. In this case, the relationship between driving command inputs and the corresponding forces generated by the actuators can be almost written as a proportional relationship in a frequency region in which the major dynamic characteristics of the motion mechanism as a target act, and hence the forces generated by the vibrating means 1811 can be easily estimated from the corresponding driving command inputs. In this case, therefore, the force sensors 1814 are not required. Assume that this embodiment uses electromagnetic actuators as the vibrating means 1811, and no force sensor 1814 is used in the following description. Recently, combinations of electromagnetic actuators such as linear motors and pneumatic actuators designed to control the internal pressures of the air springs by using valves for adjusting the supply/discharge of air to/from the air springs have been put into practice. However, electromagnetic actuators can be effectively used as the vibrating means 1811 in this apparatus.

When the force sensors 1814 are to be used, the data collecting means 1816 may collect and record output signals from the force sensors 1814 or the time-series data of the signals having undergone proper arithmetic processing as signals corresponding to signals for the vibrating means 1811 instead of signals generated by the signal generating means 1812. In this case, the data collecting means 1816 may collect and record signals corresponding to translation thrust forces and moments of rotation applied from the actuators to the motion mechanism, which are extracted by arithmetic processing of output signals from the force sensors 1814. Alternatively, the data collecting means 1816 may collect and record output time-series data from an auxiliary computation means such as the signal distribution means 1813 instead of the signals generated by the signal generating means 1812. The signals to be collected and recorded as the motion state of the motion mechanism as a target may be the time-series data of output signals from the vibration sensors 1803.

Figure 21:
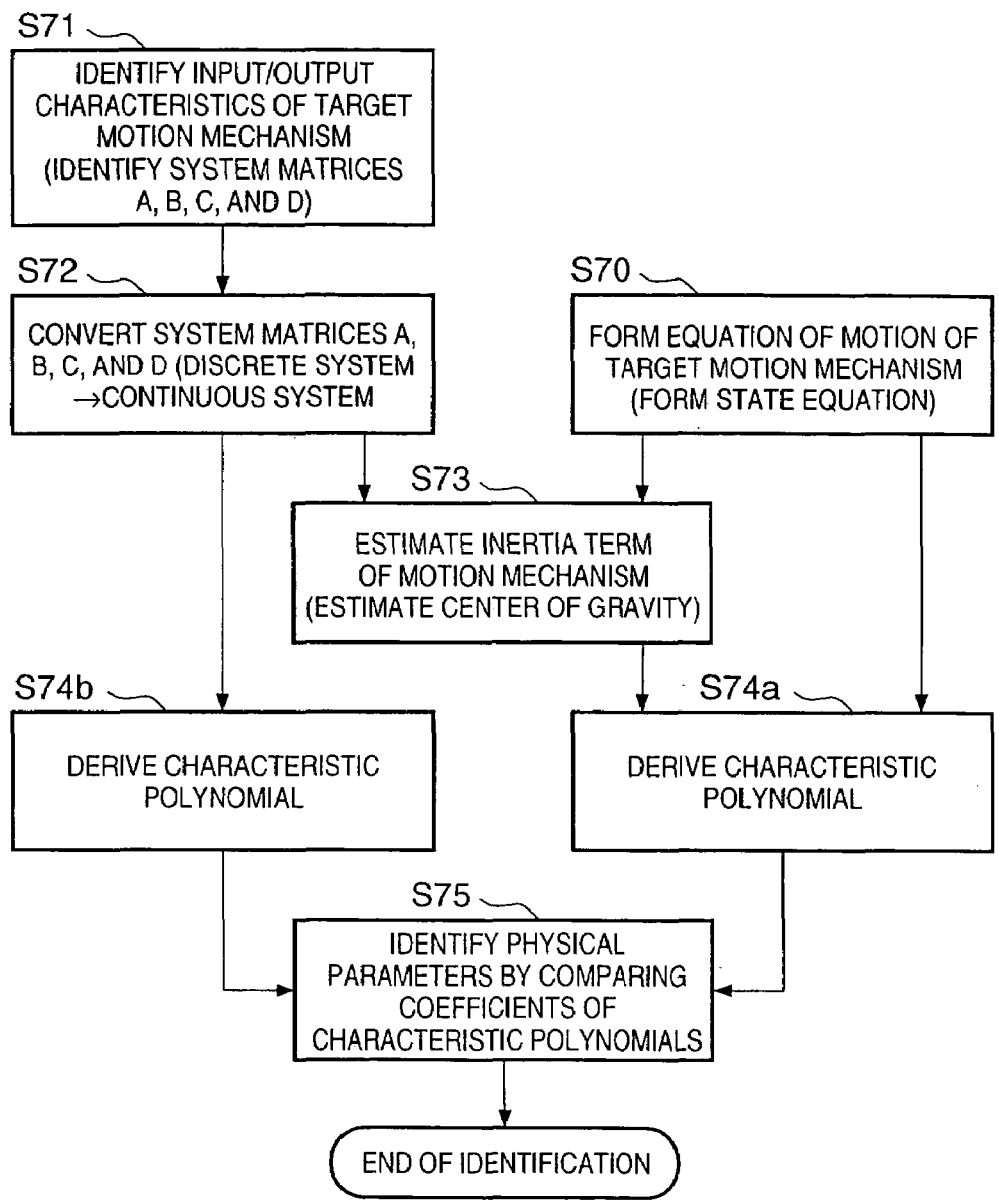
FIG. 21 is a flow diagram showing a procedure for deriving physical parameters.

In this embodiment, the signal distribution means 1813 and the vibrating means 1811 are collectively regarded as vibrating elements for the anti-vibration table 1801, the signals generated by the signal generating means 1812 are input to the target motion mechanism, and the output signals are collected in the data collecting means 1816. The physical parameters of the six-degree-of-freedom motion mechanism are identified according to the procedure shown in FIG. 21. This procedure will be described below.

<Processing in Step 70>

In step 70, an equation of motion for the six-degrees-of-freedom motion mechanism as a target is formed to derive a state equation. The motion equation for the six-degrees-of freedom motion mechanism is given as $$M\ddot{X}+C_d\dot{X}+KX=F \qquad (2)$$

where $X=[x, y, z, \theta_x, \theta_y, \theta_z]^T$ and $F=[F_x, F_y, F_z, M_x, M_y, M_z]^T$.

In equation (2), M, $C_d$, and K are constant coefficient matrices respectively representing the mass, viscous damping, and rigidity, X is a vector representing translation and rotation displacements, and F is a vector representing forces and moments acting as driving sources.

The M, $C_d$, and K matrices are expressed in the following form (2a):

$$M = \begin{bmatrix} m & 0 & 0 & 0 & 0 & 0 \\ 0 & m & 0 & 0 & 0 & 0 \\ 0 & 0 & m & 0 & 0 & 0 \\ 0 & 0 & 0 & I_{xy} & -I_{xy} & -I_{xz} \\ 0 & 0 & 0 & -I_{xy} & I_{yy} & -I_{yz} \\ 0 & 0 & 0 & -I_{xz} & -I_{yz} & I_{zz} \end{bmatrix}$$

$$C_d = \begin{bmatrix} c_{11} & c_{12} & c_{13} & c_{14} & c_{15} & c_{16} \\ c_{21} & c_{22} & c_{23} & c_{24} & c_{25} & c_{26} \\ c_{31} & c_{32} & c_{33} & c_{34} & c_{35} & c_{36} \\ c_{41} & c_{42} & c_{43} & c_{44} & c_{45} & c_{46} \\ c_{51} & c_{52} & c_{53} & c_{54} & c_{55} & c_{56} \\ c_{61} & c_{62} & c_{63} & c_{64} & c_{65} & c_{66} \end{bmatrix},$$

$$K = \begin{bmatrix} k_{11} & k_{12} & k_{13} & k_{14} & k_{15} & k_{16} \\ k_{21} & k_{22} & k_{23} & k_{24} & k_{25} & k_{26} \\ k_{31} & k_{32} & k_{33} & k_{34} & k_{35} & k_{36} \\ k_{41} & k_{42} & k_{43} & k_{44} & k_{45} & k_{46} \\ k_{51} & k_{52} & k_{53} & k_{54} & k_{55} & k_{56} \\ k_{61} & k_{62} & k_{63} & k_{64} & k_{65} & k_{66} \end{bmatrix}$$

In addition, the respective matrix elements can be obtained according to equations (2b):

$$c_{11} = \sum_i c_{xi} \quad c_{12} = 0 \quad c_{13} = 0 \tag{2b}$$

$$c_{14} = 0 \quad c_{15} = \sum_i z_i c_{xi} \quad c_{16} = \sum_i y_i c_{xi}$$

$$c_{21} = 0 \quad c_{22} = \sum_i c_{yi} \quad c_{23} = 0$$

$$c_{24} = -\sum_i z_i c_{yi} \quad c_{25} = 0 \quad c_{26} = \sum_i x_i c_{yi}$$

$$c_{31} = 0 \quad c_{32} = 0 \quad c_{33} = \sum_i c_{zi}$$

$$c_{34} = \sum_i y_i c_{zi} \quad c_{35} = -\sum_i x_i c_{zi} \quad c_{36} = 0$$

$$c_{41} = 0 \quad c_{42} = -\sum_i z_i c_{yi} \quad c_{43} = \sum_i y_i c_{zi}$$

$$c_{44} = \sum_i (y_i^2 c_{zi} + z_i^2 c_{yi}) \quad c_{45} = -\sum_i x_i y_i c_{zi} \quad c_{46} = -\sum_i x_i y_i c_{zi}$$

$$c_{51} = \sum_i z_i c_{xi} \quad c_{52} = 0 \quad c_{53} = -\sum_i x_i c_{zi}$$

$$c_{54} = -\sum_i x_i y_i c_{zi} \quad c_{55} = \sum_i (x_i^2 c_{zi} + z_i^2 c_{xi}) \quad c_{56} = -\sum_i y_i z_i c_{xi}$$

$$c_{61} = -\sum_i y_i c_{xi} \quad c_{62} = \sum_i x_i c_{yi} \quad c_{63} = 0$$

$$c_{64} = -\sum_i x_i z_i c_{yi} \quad c_{65} = -\sum_i y_i z_i c_{xi} \quad c_{66} = \sum_i (x_i^2 c_{yi} + y_i^2 c_{xi})$$

$$k_{11} = \sum_i k_{xi} \quad k_{12} = 0 \quad k_{13} = 0$$

$$k_{14} = 0 \quad k_{15} = \sum_i z_i k_{xi} \quad k_{16} = \sum_i y_i k_{xi}$$

-continued $$k_{21} = 0 \quad k_{22} = \sum_i k_{yi} \quad k_{23} = 0$$

$$k_{24} = -\sum_i z_i k_{yi} \quad k_{25} = 0 \quad k_{26} = \sum_i x_i k_{yi}$$

$$k_{31} = 0 \quad k_{32} = 0 \quad k_{33} = \sum_i k_{zi}$$

$$k_{34} = \sum_i y_i k_{zi} \quad k_{35} = -\sum_i x_i k_{zi} \quad k_{36} = 0$$

$$k_{41} = 0 \quad k_{42} = -\sum_i z_i k_{yi} \quad k_{43} = \sum_i y_i k_{zi}$$

$$k_{44} = \sum_i (y_i^2 k_{zi} + z_i^2 k_{yi}) \quad k_{45} = -\sum_i x_i y_i k_{zi} \quad k_{46} = -\sum_i x_i z_i k_{yi}$$

$$k_{51} = \sum_i z_i k_{xi} \quad k_{52} = 0 \quad k_{53} = -\sum_i x_i k_{zi}$$

$$k_{54} = -\sum_i x_i y_i k_{zi} \quad k_{55} = \sum_i (x_i^2 k_{zi} + z_i^2 k_{xi}) \quad k_{56} = -\sum_i y_i z_i k_{xi}$$

$$k_{61} = -\sum_i y_i k_{xi} \quad k_{62} = \sum_i x_i k_{yi} \quad k_{63} = 0$$

$$k_{64} = -\sum_i x_i z_i k_{yi} \quad k_{65} = -\sum_i y_i z_i k_{xi} \quad k_{66} = \sum_i (x_i^2 k_{yi} + y_i^2 k_{xi})$$

In equation (2), x, y, z, $\theta_x$, $\theta_y$, and $\theta_z$ are the translation and rotation displacements of the anti-vibration table 1801, $x_i$, $y_i$, and $z_i$ (i=1, 2, 3, 4) are the coordinates of the positions where the support means of the active anti-vibration apparatuses 1802a, 1802b, 1802c, and 1802d support the anti-vibration table 1801, $k_{xi}$, $k_{yi}$, and $k_{zi}$ (i=1, 2, 3, 4) are the spring constants (rigidities) of the active anti-vibration apparatuses 1802a, 1802b, 1802c, and 1802d, $c_{xi}$, $c_{yi}$, and $c_{zi}$ (i=1, 2, 3, 4) are the viscous damping coefficients of the active anti-vibration apparatuses 1802a, 1802b, 1802c, and 1802d, m is the mass of the anti-vibration table 1801, $I_{xx}$, $I_{yy}$, $I_{zz}$, $I_{yz}$ and are the moments of inertia/products of inertia of the anti-vibration table 1801, $F_x$, $F_y$, and $F_z$ are translation thrust forces respectively acting on a center of gravity G of the anti-vibration table 1801 in the X, Y, and Z directions, and $M_x$, $M_y$, and $M_z$ are the moments respectively acting around the X-, Y-, and Z-axes. If the apparatus center of gravity G is unknown, a virtual center of gravity G' is defined to be used as an origin. This embodiment will be described on the assumption that the apparatus center of gravity G is known. A method of estimating the unknown apparatus center of gravity G will be described in the seventh embodiment.

In general, if the four active anti-vibration apparatuses 1802a, 1802b, 1802c, and 1802d have the same structure and characteristics, the spring constants $k_{xi}$, $k_{yi}$, and $k_{zi}$ in the X, Y, and Z directions and the viscous damping coefficients $c_{xi}$, $c_{yi}$, and $c_{zi}$ become identical values $k_x$, $k_y$, and $k_z$ in the respective directions and viscous damping coefficients $c_x$, $c_y$, and $c_z$.

When the anti-vibration table 1801 is damped/supported by the four active anti-vibration apparatuses as shown in FIGS. 18 and 20, the number of variable components are four (i=1, 2, 3, 4) in correspondence with the active anti-vibration apparatuses. If, for example, the anti-vibration table 1801 is supported at three points, the number of variable components is three (i=1, 2, 3).

The equation of motion of the target motion mechanism obtained in the above manner can be written into state equation (3) below. The inputs are thrust forces and moments in the X, Y, and Z directions, and the outputs are velocities, accelerations, angular velocities, and angular accelerations in the X, Y, and Z directions.

$$\begin{bmatrix} \dot{x} \\ \ddot{x} \end{bmatrix} = A \begin{bmatrix} x \\ \dot{x} \end{bmatrix} + BF$$

$$\ddot{x} = C \begin{bmatrix} x \\ \dot{x} \end{bmatrix} + DF$$

for $$A = \begin{bmatrix} 0 & I \\ -M^{-1}k & -M^{-1}C_d \end{bmatrix}, B = \begin{bmatrix} 0 \\ M^{-1} \end{bmatrix} \quad (3)$$

$$C = [-M^{-1}K \ -M^{-1}C_d], D = M^{-1}$$

The processing in step 70 has been described above. The processing in step 70 is performed prior to the following processing and operation. The resultant information of equations (1) and (2) is loaded in the physical parameter deriving means 1817b of the identification computing means 1817 in advance.

<Processing in Step 71>

The system identification means 1817a identifies the input/output characteristics of the motion mechanism as the target on the basis of the measurement data. In the field of system identification theories, various methods of identifying the characteristics of a target system have been proposed. An appropriate algorithm is selected from those methods to perform system identification.

As is apparent from equations (1) and (2), a multi-degree-of-freedom motion mechanism such as a six-degree-of-freedom motion mechanism as the identification target is a multiple input/output system. In such a case, a subspace identification method is effective, in which system matrices A, B, C, and D in a state equation like equation (2) are set as identification models, and these models can be directly identified. A method of obtaining the system matrices A, B, C, and D of the motion mechanism by using the subspace identification method will be described below. The subspace identification method is a method of setting the system matrices A, B, C, and D of a state space model as identification models. This method is essentially suited for efficient identification of a multiple input/output system.

In this step, the input/output relationship between vibration input commands to the motion mechanism using the vibrating means 1811 and detection output signals based on the accelerations and angular accelerations of the target motion mechanism are identified, as indicated by equation (4).

In this embodiment, electromagnetic actuators, such as linear motors, are used as the vibrating means 1811. The relationship between driving command inputs to electromagnetic actuators such as linear motors and the corresponding forces generated by the actuators can be almost written as a proportional relationship in a frequency region in which the major dynamic characteristics of a motion mechanism of this type act. Therefore, equation (4) can be substantially regarded as being equivalent to a case in which translation thrusts and moments of rotation are input to the six-degrees-of-freedom motion mechanism by using the vibrating means 1811.

$$\begin{bmatrix} A_x \\ A_y \\ A_z \\ A_{\theta x} \\ A_{\theta y} \\ A_{\theta z} \end{bmatrix} = \begin{bmatrix} G_{11} & G_{12} & G_{13} & G_{14} & G_{15} & G_{16} \\ G_{21} & G_{22} & G_{23} & G_{24} & G_{25} & G_{26} \\ G_{31} & G_{32} & G_{33} & G_{34} & G_{35} & G_{36} \\ G_{41} & G_{42} & G_{43} & G_{44} & G_{45} & G_{46} \\ G_{51} & G_{52} & G_{53} & G_{54} & G_{55} & G_{56} \\ G_{61} & G_{62} & G_{63} & G_{64} & G_{65} & G_{66} \end{bmatrix} \begin{bmatrix} u_x \\ u_y \\ u_z \\ u_{\theta x} \\ u_{\theta y} \\ u_{\theta z} \end{bmatrix} \quad (4)$$

where $A_x$, $A_y$, and $A_z$ are the acceleration output signals in the X, Y, and Z directions, $A_{\theta x}$, $A_{\theta y}$, and $A_{\theta z}$ are the angular acceleration output signals in the $\theta_x$, $\theta_y$, and $\theta_z$ directions, $u_x$, $u_y$, and $u_z$ are thrust force commands in the X, Y, and Z directions, and $u_{\theta x}$, $u_{\theta y}$, and $u_{\theta z}$ are moment commands in the $\theta_x$, $\theta_y$, and $\theta_z$ directions.

In this case, the accelerations in the X, Y, and Z directions and the angular accelerations in the $\theta_x$, $\theta_y$, and $\theta_z$ directions are derived by performing real-time arithmetic processing for output signals from the respective vibration sensors 1803 on the basis of the detecting directions and geometrical arrangement of the vibration sensors 1803 mounted on or near the respective support portions of the anti-vibration apparatuses. The respective vibrating means 1811 are driven on the basis of the thrust force commands in the X, Y, and Z directions and the moment commands in the $\theta_x$, $f_y$, and $\theta_z$ directions according to the mathematical expression derived in consideration of the acting directions and geometrical arrangement of the vibrating means. Every arithmetic processing is performed on the basis of a coordinate system having the apparatus center of gravity G as an origin. If the apparatus center of gravity G is unknown, the virtual center of gravity G' is defined to be used as an origin.

Figure 22:
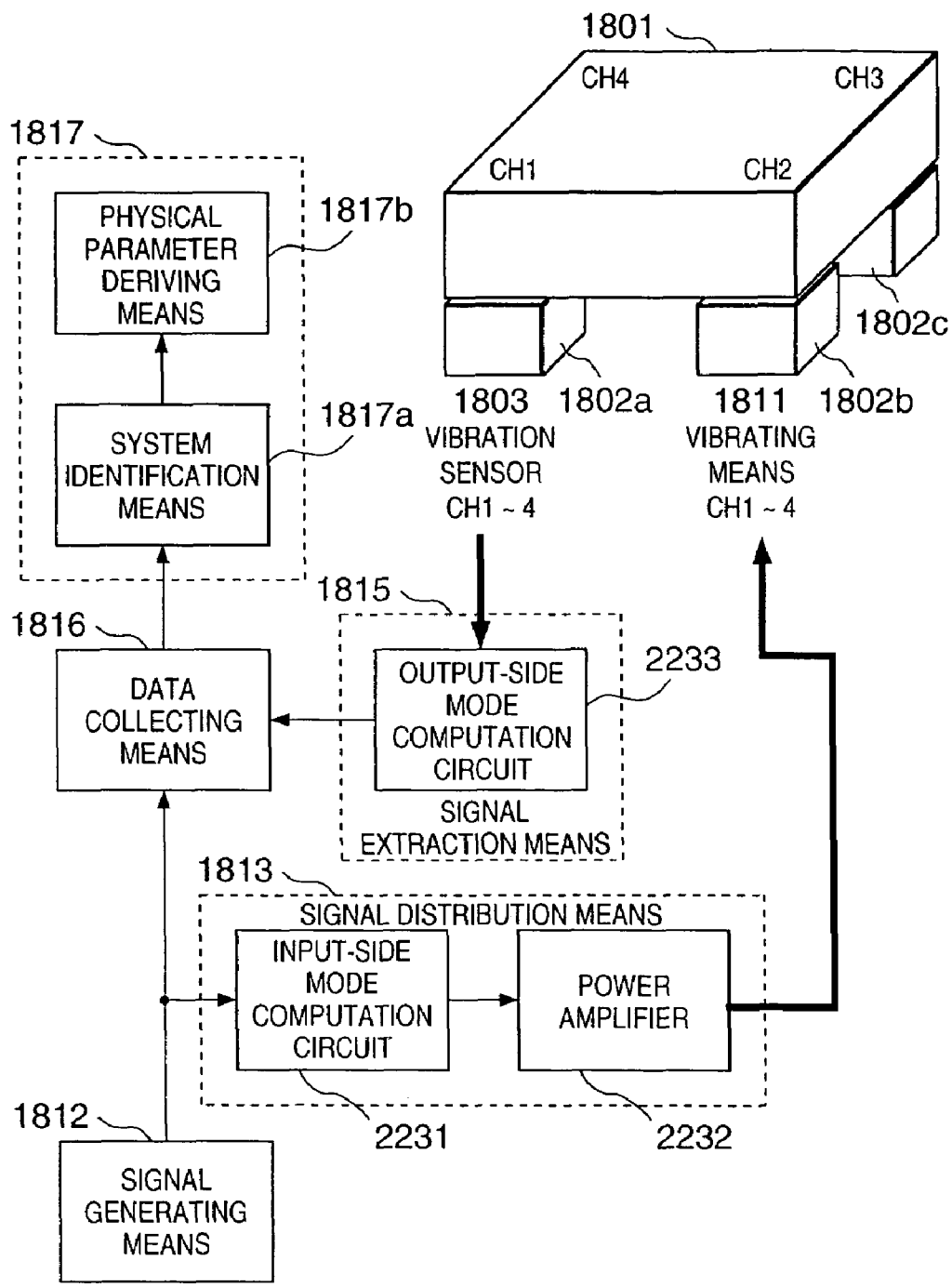
FIG. 22 is a block diagram showing data processing for deriving physical parameters.

FIG. 22 shows the detailed arrangement of the apparatus for identifying the input/output relationship expressed by equation (3).

Thrust force commands in the X, Y, and Z directions and moment commands in the $\theta_x$, $\theta_y$, and $\theta_z$ directions, which are used to vibrate the six-degree-of-freedom motion mechanism, are output from the signal generating means 1812. These commands are supplied to the respective vibrating means 1811 through the signal distribution means 1813 constituted by an input-side mode computation circuit 2231 for computing/distributing thrust force/moment commands to the respective vibrating means 1811 and a current mode amplifier 2232. As the thrust force commands in the X, Y, and Z directions and the moment commands in the $\theta_x$, $\theta_y$, and $\theta_z$ directions, pseudo-random signals such as M-sequence signals, which are uncorrelated with each other, are preferably used. M-sequence signals are white binary signals, which can excite many frequency components of the motion mechanism as the identification target.

Output signals from the vibration sensors 1803 are converted into accelerations in the X, Y, and Z directions and angular accelerations in the $\theta_x$, $\theta_y$, and $\theta_z$ directions by the signal extraction means 1815 constituted by an output-side mode computation circuit 2233. These time-series data are loaded into the data collecting means 1816, together with the time-series input data of the thrust force and moment commands to the vibrating means 1811.

FIGS. 23A to 23F show the actually measured waveforms of thrust force commands $u_x$ and $u_y$ in the X and Y directions, a moment command $u_{\theta z}$ in the $\theta_z$ direction, acceleration output signals $A_x$ and $A_y$ in the X and Y directions, and an angular acceleration output signal $A_{\theta z}$ in the $\theta_z$ direction, as examples of input and output data.

The input/output data loaded into the data collecting means 1816 are subjected to identification computation processing in the system identification means 1817a. The subspace identification method is applied to an identification computation. In this processing, commercially available numerical computation software typified by "MATLAB" or the like can be used. In this case, appropriate pre-processing such as decimation is preferably performed for the input/output data in advance. With the above processing, the system matrices A, B, C, and D expressing the input/output characteristics of equation (3) are derived.

In this case, the input/output characteristics are identified, with the thrust force and moment commands to the motion mechanism in the X, Y, and Z directions being considered as inputs, and acceleration and angular acceleration output signals for the motion mechanism in the X, Y, and Z directions being considered as outputs.

The physical parameters to be derived in this case are based on the input/output characteristics with the thrust forces and moments acting on the motion mechanism as inputs and the accelerations and angular accelerations acting on the motion mechanism in the X, Y, and Z directions as outputs. In this step, the system matrices are corrected, as needed, in consideration of the gains of thrust forces and moments and the detection gains of accelerations and angular accelerations acting on the motion mechanism on the basis of thrust and moment commands.

In many cases, actual motion mechanisms are often controlled in the same manner as in the active anti-vibration apparatuses in this embodiment. When the characteristics of such a target in a state in which no control is performed are to be identified, a closed loop identification method may be used, in which the characteristics of a control system closed loop are converted into the characteristics of an open loop in consideration of the characteristics of a control computation apparatus in the control loop. Obviously, if the control loop can be opened for this identification processing, the characteristics of the open loop, which has no direct influence on control operation, may be directly identified.

<Processing in Step 72>

Although the system matrices A, B, C, and D are identified in the above manner, a system identification theory of this type generally aims at a discrete time system based on time-series data obtained by sampling the physical amount of a real system at predetermined time intervals. On the other hand, the characteristics of a motion mechanism are handled by a continuous time system such as a motion equation based on the dynamic characteristics of the target motion mechanism.

The system matrices A, B, C, and D of the discrete time system obtained by identification are converted into system matrices A, B, C, and D of the continuous time system. Various algorithms have also been proposed for conversion from this discrete time system to the continuous time system. Conversion is performed by using such an algorithm. This arithmetic processing is performed by the system identification means 1817a.

<Processing in Step 73>

Subsequently, physical parameters are identified on the basis of the equations and data obtained so far. The following arithmetic processing is performed by the physical parameter deriving means 1817b.

First of all, considering the system matrix D, and the mass m, moments of inertia/products of inertia $I_{xx}$, $I_{yy}$, $I_{zz}$, $I_{xy}$, $I_{xz}$, and $I_{yz}$ of the anti-vibration table 1801 are derived. These parameters can be identified by the processing in the step described below alone without executing this step. If, however, there are many unknown physical parameters, proper identification may not be performed by the apparatus and method to be described below alone. In addition, the load of the algebraic computations can be reduced if the number of unknown parameters can be decreased. For these reasons, it is preferable that this step be effectively executed. Obviously, if these physical parameters are known, and there is no possibility of changes in characteristic values in the design stage, this step can be omitted.

The operation in this step will be described below.

As is apparent from equations (1) and (2), if the input/output characteristics of the motion mechanism identified above are based on thrust forces and moments acting on the motion mechanism as inputs, and accelerations and angular accelerations acting on the motion mechanism as outputs, the system matrix D is given by the mass, moments of inertia, and products of inertia of the anti-vibration table 1801. The expression of system characteristics based on a state equation is characterized in that the system matrices A, B, and C change depending on parameters taken as state amounts. The system matrix D is a term that directly defines the transfer characteristics of inputs/outputs to/from the motion mechanisms as the target. That is, the system matrix D is a term that directly describes the relationship between input and output physical amounts and is uniquely determined regardless of the manner in which state amounts are determined.

The mass, moments of inertia, and products of inertia of the anti-vibration table 1801 can be identified by comparing the system matrix D identified by using the subspace identification method or the like with the system matrix D based on equations (1) to (2b).

<Processing in Steps 74 and 75>

Finally, physical parameters are identified. Assume that physical characteristic values associated with the mass, moments of inertia, and products of inertia of the anti-vibration table 1801 have been derived in the previous step. Identification of the remaining parameters, e.g., the spring constants and viscous damping coefficients of the support means constituting the active anti-vibration apparatus 1802 will be described. The remaining unknown physical parameters are the spring constants $k_x$, $k_y$, and $k_z$ and viscous damping coefficients $c_x$, $c_y$, and $c_z$ in the X, Y, and Z directions.

According to the present invention, a characteristic polynomial for the motion mechanism as the target remains the same regardless of how a state amount is defined in the state equation. That is, the physical parameters are identified considering that the characteristic polynomial based on the system matrices obtained as the identification results of the real system in steps 71 and 72 is the same as that based on the system matrices written in equation (2).

Since the state amounts based on the system matrices A, B, and C written in equation (2) do not necessarily coincide with those based on the system matrices A, B, and C derived by the system identification means 1817a in steps 71 and 72, these system matrices do not necessarily coincide with each other. This is because the system identification method executed in step 71 does not allow arbitrary selection of state amounts in the state equation. If, however, the target system remains unchanged, the characteristic, eigenvalue, and characteristic polynomial unique to the system remain the same. Therefore, the system matrices obtained as the identification results of the real system in steps 71 and 72 have the same characteristic polynomial as that of the system matrices written in equation (2). In the present invention, physical parameters are identified in consideration of this point.

Note that this processing is based on the premise that the system degree identified in steps 71 and 72 coincides with the system degree of the model written by the equation of motion for the motion mechanism. For example, in the six-degrees-of-freedom motion mechanism, as is obvious from equations (1) to (2b), there is a twelfth-degree system, i.e., twelve eigenvalues of the system matrix A. Therefore, identification processing must be performed in advance assuming that each of the system matrices A, B, C, and D in steps 71 and 72 is also a twelfth-degree model.

A procedure for identifying physical parameters will be described in detail below.

First of all, a characteristic polynomial for the system is obtained on the basis of the state equation of equation (3) formulated on the basis of an equation of motion, and the like (step 74a). Since the motion mechanism as the target of in this embodiment is a twelfth-degree system, the following characteristic polynomial is obtained:

$$S^{12} + a_{11}s^{11} + a_{10}s^{10} + \ldots + a_2 s^2 + a_1 s^1 + a_0 \quad (5)$$

Letting s be a Laplacean operator and I be an identity matrix of the same degree as that of the system matrix A, mathematical expression (5) can be summarized into mathematical expression (6):

$$\det(sI - A) \quad (6)$$

In this case, the system matrices in equation (2) based on the equation of motion are written as algebraic matrices including unknown physical parameters. Therefore, coefficients $s^{11}, \ldots, a_0$ of s are given as algebraic expressions of the unknown physical parameters.

Likewise, a characteristic polynomial for the system obtained by the processing in steps 71 and 72 is obtained (step 74b).

$$s^{12} + a'_{11}s^{11} + a'_{10}s^{10} + \ldots + a'_2 s^2 + + a'_1 s + a'_0 \quad (7)$$

In this case, since the system matrices obtained as the identification results become numerical matrices, all the coefficients $a'_{11}, \ldots, a'_0$ become numerical values (constant coefficients including no function).

Finally, the unknown physical parameters are identified by comparing the coefficients of both the characteristic polynomials of mathematical expressions (5) and (7). That is, the unknown physical parameters are derived on the basis of the condition that $a_{11}$ and $a'_{11}$ are equal to each other, and so are $a_{10}$ and $a'_{10}, \ldots, a_0$ and $a'_0$.

Estimation of physical parameters based on comparison between coefficients can be easily executed by a method of solving simultaneous equations if the number of unknown physical parameters is equal to that of coefficients to be compared, i.e., condition equations are the same. As in this embodiment, when the number of unknown physical parameters is less than that of a condition equation, or the influences of the characteristics of a portion which is not modeled are not small, the unknown physical parameters may be identified by using an optimization method. The unknown physical parameters can be derived by a sweepest descent method in such a manner that a performance function of equation (8) is set to minimize the differences between the coefficients of characteristic polynomials of mathematical expressions (5) and (7), and arithmetic processing is executed to minimize them.

$$J = \sum_{i=0}^{11} (a_i - a'_i)^2 \quad (8)$$

This performance function is written as a function of unknown parameters $\xi_j$ (j=1, 2, . . . , 6). In this case, $\xi_j$ represents unknown physical parameters $k_x$, $k_y$, $k_z$, $c_x$, $c_y$, and $c_z$.

Appropriate initial values are set for the unknown physical parameters $\xi_j$, and equation (9) below is repeatedly solved, thereby obtaining the numerical values of the physical parameters $\xi_j$ with which the performance function J is minimized.

$$\xi_j(k+1) = \xi_j(k) - 2\sigma \frac{\partial J}{\partial \xi_j} \quad (9)$$

where σ is an appropriate positive number.

With the above procedure and arrangement, the physical parameters of the six-degree-of-freedom motion mechanism can be identified.

If the damping characteristic value of a motion mechanism as a target is sufficiently small, identification arithmetic processing can be further simplified by performing identification processing upon setting the viscous damping coefficient of the active anti-vibration apparatus 1802 to zero. In this case, equations (2) and (3) can be further simplified, and the terms of mathematical expressions (5) and (7) become zero except for the terms of the even-numbered powers of s. In general, an anti-vibration apparatus using an air spring for an anti-vibration support means, in particular, is known as an apparatus having a small passive damping characteristic value based on mechanical parts. In such a case, identification of a pair of physical parameters is relatively easy. Assume that a target is an active anti-vibration apparatus of a type using air springs, its characteristics are adjusted by a control loop, and damping characteristics are provided for the apparatus. Even in this case, the open loop characteristics, i.e., characteristics in a passive state, can be easily identified by effectively using the closed loop identification method. Therefore, the mechanism characteristics of constituent elements can be performed relatively easily on the premise that the passive damping coefficients are sufficiently small.

Seventh Embodiment

The sixth embodiment has been described on the assumption that the center of gravity of the apparatus is known. A method of estimating a true center of gravity G of an apparatus when the center of gravity G is unknown will be describe below.

First of all, the center of gravity of the apparatus is postulated as a virtual center of gravity G'. As shown in FIG. 24, the distances between the virtual center of gravity G' and the true center of gravity G in the X, Y, and Z directions are respectively represented by $L_x$, $L_y$, and $L_z$. In this case, if the true center of gravity G of the apparatus is located in a positive direction in the XYZ coordinate system with respect to the virtual center of gravity G', the polarities of $L_x$, $L_y$, and $L_z$ are defined as positive. When the true center of gravity G is located in a negative direction, the polarities are defined as negative.

Subsequently, the equation (3) is rewritten by incorporating difference information between the virtual center of gravity G' and the true center of gravity G.

Letting $F_{x0}$, $F_{y0}$, $F_{y0}$, $M_{x0}$, $M_{y0}$, and $M_{z0}$ be the translation thrust forces acting on the virtual center of gravity G' in the X, Y, and Z directions and moments of rotation about $\theta_x$, $\theta_y$, and $\theta_z$, the relationship among these values is expressed as:

$$\begin{bmatrix} F_x \\ F_y \\ F_z \\ M_x \\ M_y \\ M_z \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & L_z & -L_y & 1 & 0 & 0 \\ -L_z & 0 & L_x & 0 & 1 & 0 \\ L_y & -L_x & 0 & 0 & 0 & 1 \end{bmatrix} \begin{bmatrix} F_{x0} \\ F_{y0} \\ F_{z0} \\ M_{x0} \\ M_{y0} \\ M_{z0} \end{bmatrix} \quad (10)$$

Letting $\ddot{x}_0$, $\ddot{y}_0$, $\ddot{z}_0$, $\ddot{\theta}_{x0}$, $\ddot{\theta}_{y0}$, and $\ddot{\theta}_{z0}$ be the translation acceleration outputs acting on the virtual center of gravity G' in the X, Y, and Z directions and rotation angular acceleration outputs about $\theta_x$, $\theta_y$, and $\theta_z$, and $\ddot{x}$, $\ddot{y}$, $\ddot{z}$, $\ddot{\theta}_x$, $\ddot{\theta}_y$, $\ddot{\theta}_z$, be the translation acceleration outputs acting on the true center of gravity G in the X, Y, and Z directions and rotation angular acceleration outputs about the true center of gravity G, the relationship among these values is expressed as:

$$\begin{bmatrix} \ddot{x}_0 \\ \ddot{y}_0 \\ \ddot{z}_0 \\ \ddot{\theta}_{x0} \\ \ddot{\theta}_{y0} \\ \ddot{\theta}_{z0} \end{bmatrix} = \begin{bmatrix} 1 & 0 & 0 & 0 & -L_z & L_y \\ 0 & 1 & 0 & L_z & 0 & -L_x \\ 0 & 0 & 1 & -L_y & -L_x & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \begin{bmatrix} \ddot{x} \\ \ddot{y} \\ \ddot{z} \\ \ddot{\theta}_x \\ \ddot{\theta}_y \\ \ddot{\theta}_z \end{bmatrix} \quad (11)$$

When the state equation (2) is arranged by applying these relationships to the state equation and setting translation thrust forces and moments of rotation acting on the virtual center of gravity G' as inputs to the system, and translation accelerations on the virtual center of gravity G' and rotation angular accelerations about the virtual center of gravity G' as outputs, the system matrices A, B, C, and D are expressed as:

$$\begin{bmatrix} \dot{X} \\ \ddot{X} \end{bmatrix} = A \begin{bmatrix} X \\ \dot{X} \end{bmatrix} + BF_0 \quad (12)$$

$$\ddot{X}_0 = C \begin{bmatrix} X \\ \dot{X} \end{bmatrix} + DF_0$$

for $X_0 = [x_0, y_0, z_0, \theta_{x0}, \theta_{y0}, \theta_{z0}]^T$ $F_0 = [F_{x0}, F_{y0}, F_{z0}, M_{x0}, M_{y0}, M_{z0}]^T$ $A = \begin{bmatrix} 0 & I \\ -M^{-1}K & -M^{-1}C_d \end{bmatrix}$, $B = \begin{bmatrix} 0 \\ M^{-1} \end{bmatrix} T_a$ $C = T_s[-M^{-1}K \quad -M^{-1}C_d]$, $D = T_s M^{-1} T_a$ $$T_a = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & L_z & -L_y & 1 & 0 & 0 \\ -L_z & 0 & L_x & 0 & 1 & 0 \\ L_y & -L_x & 0 & 0 & 0 & 1 \end{bmatrix},$$

$$T_s = \begin{bmatrix} 1 & 0 & 0 & 0 & -L_z & L_y \\ 0 & 1 & 0 & L_z & 0 & -L_x \\ 0 & 0 & 1 & -L_y & L_x & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix}$$

When, therefore, the system matrix D is obtained by performing the processing in steps 71 and 72 in the sixth embodiment with respect to the coordinate system having the virtual center of gravity G' as an origin, and the elements are compared with those of the system matrix of equation (11), the distances $L_x$, $L_y$, and $L_z$ between the virtual center of gravity G' and the true center of gravity G can be estimated, together with the mass, moments of inertia, and products of inertia of the anti-vibration table 1801. This processing is preferably executed in step 73 in FIG. 21. Physical parameters such as spring constants and viscous damping coefficients can be identified more accurately by reflecting the obtained center-of-gravity information in equations (2) and (3) and proceeding with the procedure described in the sixth embodiment.

Eighth Embodiment

If the total number of variable physical parameters of the elements constituting a motion mechanism, other than those associated with inertia, is equal to or less than the system degree, variations in the physical parameters of all the elements can be known and apparatus abnormalities accompanying variations in the characteristics of the constituent elements of the apparatus can be diagnosed and detected by the techniques described in the sixth and seventh embodiments.

Figure 25:
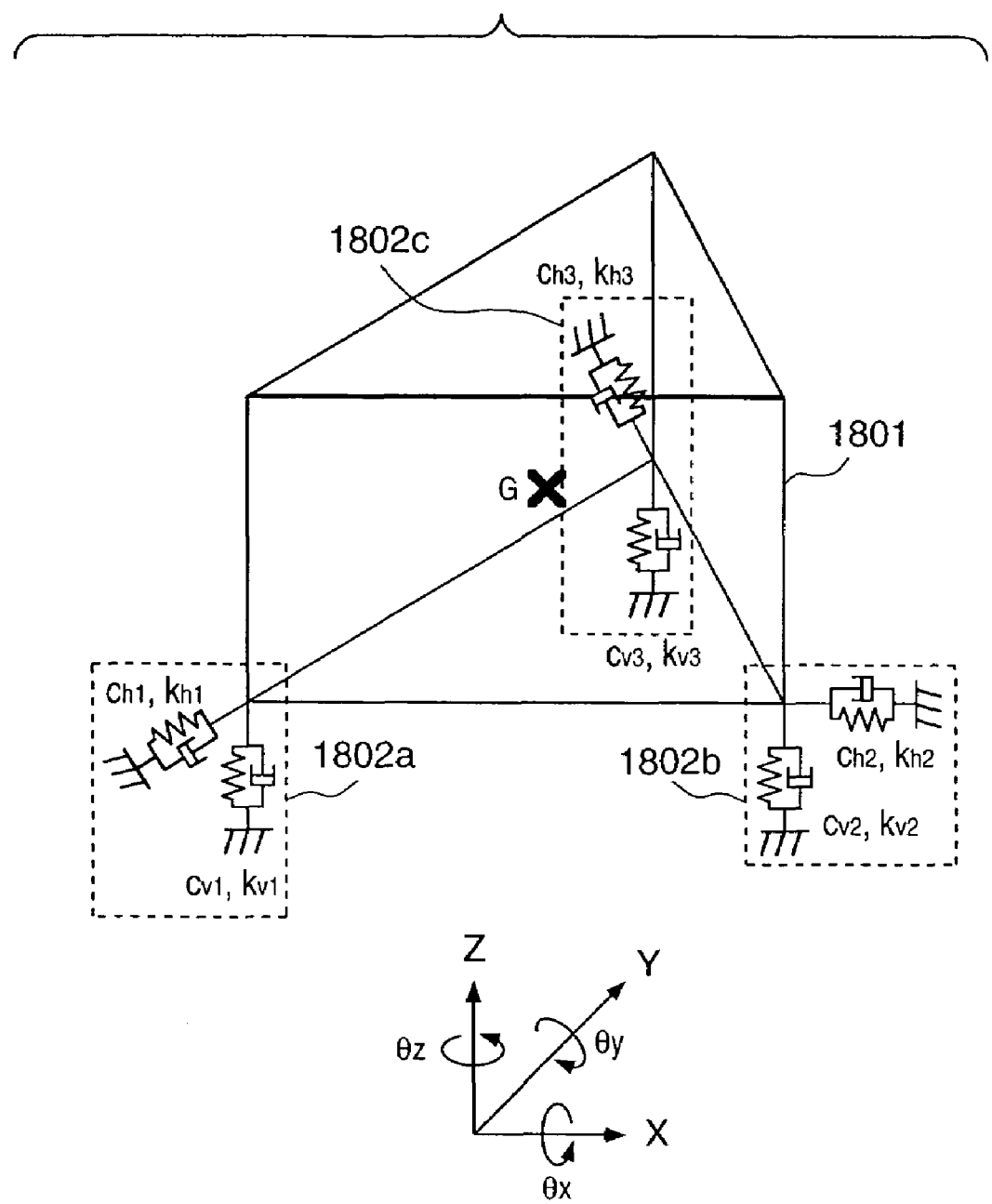
FIG. 25 is a view showing an example of a motion mechanism for identifying characteristics.

Changes in the physical characteristic values of the mechanical and electrical elements constituting the motion mechanism over time are monitored to self-diagnose the state of the mechanism, thereby detecting an abnormality. The overall system can be self-diagnosed and abnormality detection can be performed by identifying the characteristics of the motion mechanism incorporated in a large apparatus such as an X-Y stage or active anti-vibration apparatus and the characteristics of the mechanical and electrical elements constituting the motion mechanism. An exposure apparatus which incorporates an apparatus for identifying physical parameters to monitor changes in dynamic characteristics over time, and reflects changes in a control law for the apparatus also falls within the gist of the present invention. Consider, for example, a six-degree-of-freedom motion mechanism schematically shown in FIG. 25.

The six-degrees-of-freedom motion mechanism is comprised of active anti-vibration apparatuses 1802a, 1802b, and 1802c having spring and damping elements in only a vertical or horizontal direction and an anti-vibration table 1801 supported by these three active anti-vibration apparatuses. In this motion mechanism, the horizontal spring and damping elements are arranged parallel to the respective sides of a triangle defined by the three support points of the anti-vibration table 1801 as vertexes.

Assume that, as unknown physical parameters, the spring constants of the respective support units in the vertical and horizontal directions are respectively represented by $k_{v1}$, $k_{v2}$, $k_{v3}$, $k_{h1}$, $k_{h2}$, and $k_{h3}$, and the viscous damping coefficients in the vertical and horizontal directions are respectively represented by $c_{v1}$, $c_{v2}$, $C_{v3}$, $c_{h1}$, $c_{h2}$, and $c_{h3}$. In this case, the system degree of the six-degrees-of-freedom motion mechanism is twelve, and twelve unknown parameters are present. These physical parameters can be identified by the same techniques as those described in the sixth and seventh embodiments. The mass and moments of inertia of the anti-vibration table 1801 are to be identified in consideration of the system matrix D.

In the sixth embodiment, all the spring constants of the anti-vibration apparatus support units in the vertical direction are set to the same value. In contrast to this, the eighth embodiment is based on the premise that all these spring constants can take different values. According to this technique, variations in characteristics of each of the same type of elements constituting an apparatus over time can be monitored, and abnormalities in the apparatus can be diagnosed and detected.

Note that this technique is not limited to identification of physical characteristic values associated with the spring constants, damping coefficients, and inertia of a target. If, for example, unknown parameters are the thrust force constants of actuators and the characteristic parameters of vibration sensors, this technique can be used as a method of detecting abnormalities in these element parts.

Ninth Embodiment

In the description of the sixth and seventh embodiments, according to the characteristic polynomial for the motion mechanism as the target, the system matrices A, B, C, and D are identified by the technique based on the system identification theory. However, a characteristic polynomial can be formulated on the basis of the polarities and eigenvalues of the system which are obtained by performing curve fitting, pole-zero analysis, and the like, with respect to the frequency characteristics of the target motion mechanism obtained by sine sweep vibrating operation.

In this case, frequency response characteristics associated with input/output gain and phase relationships are derived on the basis of the time-series data recorded on a data collecting means 1816 when operation of a vibrating means 1811 on the motion mechanism serves as an input and the motion state of the motion mechanism in response to the input servers as an output.

The eigenvalues of the target motion mechanism are derived by performing curve fitting, pole-zero analysis, and the like, with respect to the frequency characteristics. The characteristic polynomial is expressed as follows when the eigenvalues of the target motion mechanism are respectively represented by P1, $P_2$, ..., $P_{12}$.

$$(s-P_1)_{(s-P2)} \ldots (s-P_{12}) \tag{13}$$

If the processing disclosed in the sixth embodiment is performed by using the characteristic polynomial obtained in this manner, physical parameters can be identified.

According to the sixth to ninth embodiments of the present invention, there are provided/disclosed apparatuses and methods which combine the input/output characteristics of a multi-degree-of-freedom motion mechanism with the physical parameters representing the characteristics of mechanical and electrical elements constituting the motion mechanism in consideration of a characteristic polynomial dominating the behavior characteristics of the motion mechanism, thereby systematically and efficiently deriving the physical parameters of the constituent elements of the multi-degree-of-freedom motion mechanism, unlike the prior art in which it is difficult to perform such operation. With these apparatuses and methods, operation of this type, which has been performed by trial and error with great dependence on the knowledge and experience which a skilled operator has, can be efficiently performed in a short period of time with a required precision. This allows quick and accurate understanding of the characteristics of an apparatus, and provides more precise information for control design and re-design of a mechanical system, thereby greatly contributing to an improvement in the characteristics of the motion mechanism of precision equipment.

In addition, according to this method and apparatus, if a mechanical model of a target is specified, the characteristics of each constituent element of the apparatus can be identified in a relatively short period of time. This allows self-diagnosis and abnormality detection for industrial equipment such as a semiconductor exposure apparatus without sacrificing the productivity and operation efficiency of the apparatus. Diagnosis and maintenance can therefore be performed periodically at a proper timing by predicting changes in the characteristics of the motion mechanism which occur over time upon operation of the apparatus. By monitoring changes in characteristics in a time-series manner and reflecting the corresponding information in a control law, the performance of the apparatus can be actively maintained.

(Embodiment of a Device Manufacturing Method)

An embodiment of a device manufacturing method using the above exposure apparatus will be described next.

Figure 10:
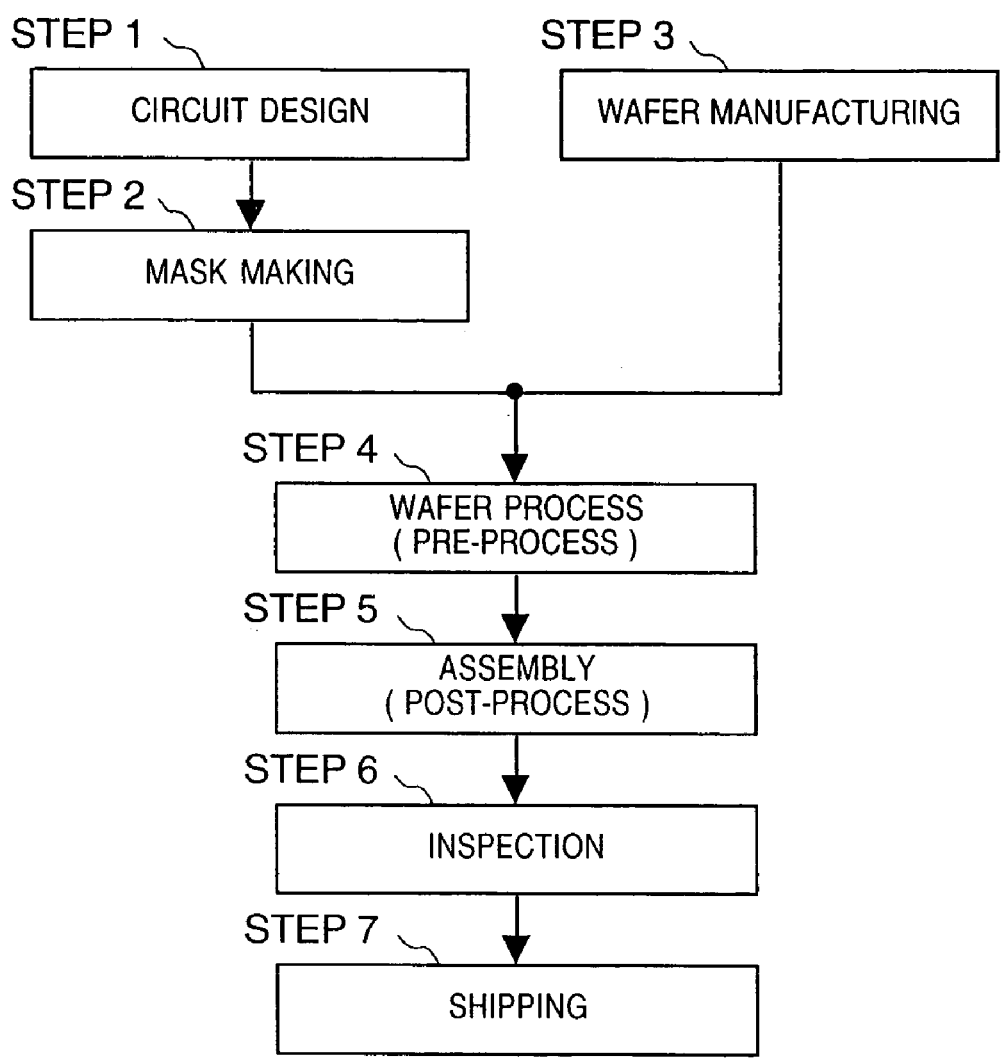
FIG. 10 is a flow diagram showing a procedure for manufacturing a microdevice.

FIG. 10 is a flow diagram showing a procedure for manufacturing a microdevice (e.g,. a semiconductor chip of an IC, LSI, or the like, a liquid crystal panel, a CCD, a thin-film magnetic head, a micromachine, or the like). In step 1 (circuit design), a device pattern is designed. In step 2 (mask making), a mask on which the designed pattern is formed is made. In step 3 (wafer manufacturing), a wafer is manufactured by using a material such as silicon or glass. Step 4 (wafer process), is called a pre-process, in which an actual circuit is formed on the wafer by lithography using the prepared mask and wafer. The next step, step 5 (assembly), is called a post-process, in which the wafer manufactured in step 4 is formed into a semiconductor chip. This process includes an assembly step (dicing and bonding), a packaging step (chip encapsulation), and the like. In step 6 (inspection), an operation test, a durability test, and the like, are performed for the semiconductor device manufactured in step 5. The semiconductor device is completed through such steps and shipped (step 7).

Figure 11:
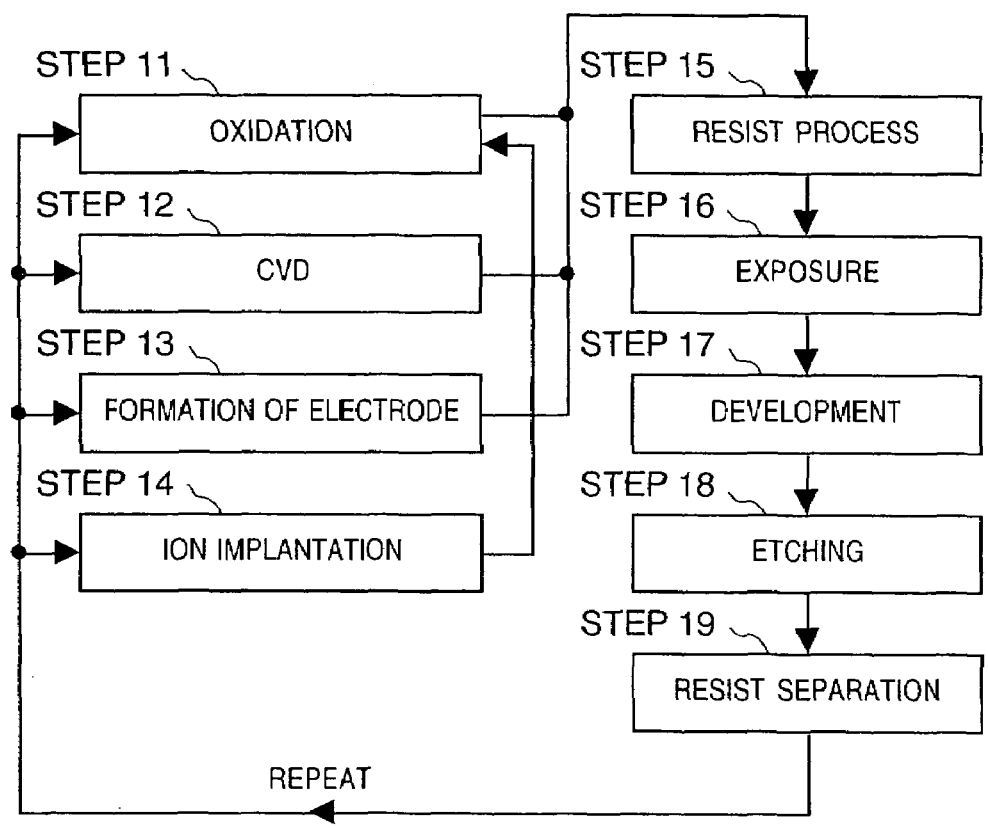
FIG. 11 is a flow diagram showing the wafer process in FIG. 10 in detail.

FIG. 11 is a flow diagram showing the wafer process in detail. In step 11 (oxidation), the surface of the wafer is oxidized. In step 12 (CVD), an insulating film is formed on the wafer surface. In step 13 (formation of electrodes), electrodes are formed on the wafer by vapor deposition. In step 14 (ion implantation), ions are implanted into the wafer. In step 15 (resist process), the wafer is coated with a photosensitive agent. In step 16 (exposure), the circuit pattern on the mask is printed/exposed on the wafer by the exposure apparatus having the above system identification function. In step 18 (etching), portions other than the developed resist image are etched. In step 19 (resist separation), the resist which has become unnecessary upon completion of etching is removed. By repeating these steps, circuit patterns are stacked on the wafer.

By using the manufacturing method of this embodiment, a high-integration device, which has been difficult to manufacture in the prior art, can be manufactured at a low cost.

In the first to ninth embodiments and the embodiment of the device manufacturing method, the system identification function of the present invention is mainly applied to semiconductor exposure apparatuses. However, the present invention can also be applied to semiconductor manufacturing apparatuses, other than semiconductor exposure apparatuses, and exposure apparatuses used to manufacture, for example, liquid crystal devices other than semiconductor devices.

In the above description, the most common M-sequence signals are used as pseudo-random signals. However, other types of pseudo-random signals can be used. As pseudo-random signals to be independently applied to each actuator in units of degrees-of-freedom of motion, in particular, one type of pseudo-random signals suffice, and hence, M-sequence signals need not always be used.

The present invention is not limited to the above embodiments and various changes and modifications can be made within the spirit and scope of the present invention. Therefore, to apprise the public of the scope of the present invention, the following claims are made.

What is claimed is:

1. A motion control method for a motion mechanism in which motion of a structure is controlled, the motion mechanism being in an exposure apparatus for exposing a substrate to a pattern, the motion mechanism including the structure, a plurality of actuators to apply forces to the structure, respectively, and a plurality of sensors to sense motion states of the structure, respectively, said method comprising steps of:

applying a plurality of pseudo-random signals generated by a signal generator to the plurality of actuators, the plurality of pseudo-random signals being equal in number to a number of degrees of freedom of the motion control system;

storing, in a storage, a first plurality of time-series data obtained by the plurality of sensors with a second plurality of time-series data corresponding to the plurality of pseudo-random signals; and deriving a characteristic of the motion mechanism based on the first and second plurality of time-series data.

2. A method according to claim 1, wherein the plurality of pseudo-random signals applied in said applying step are noncorrelated with each other.

3. A method according to claim 1, wherein the plurality of pseudo-random signals are applied in said applying step via a switch configured to switch a state of connection between the signal generator and the plurality of actuators.

4. A method according to claim 1, wherein the plurality of pseudo-random signals are applied in said applying step to the plurality of actuators in one-to-one correspondence.

5. A method according to claim 1, wherein one of the plurality of pseudo-random signals is applied in said applying step to at least a portion of the plurality of actuators, with respect to each of the degrees of freedom.

6. A method according to claim 1, wherein the characteristic includes at least one of a frequency response, a physical parameter, a resonance frequency, a damping coefficient, a gain margin, and a phase margin of the motion mechanism.

7. A method according to claim 1, wherein one of the plurality of actuators is an electromagnetic motor.

8. A method according to claim 1, wherein the motion mechanism includes an anti-vibration mechanism configured to suppress vibration of the structure.

9. A method according to claim 1, wherein the motion mechanism includes a movable stage.

10. A method according to claim 1, wherein each of the plurality of pseudo-random signals is a maximum-length linear shift register sequence signal.

* * * * *

UNITED STATES PATENT AND TRADEMARK OFFICE
CERTIFICATE OF CORRECTION

| | |
|---|---|
| PATENT NO. | : 7,072,777 B1 |
| APPLICATION NO. | : 09/333522 |
| DATED | : July 4, 2006 |
| INVENTOR(S) | : Shinji Wakui et al. |

It is certified that error appears in the above-identified patent and that said Letters Patent is hereby corrected as shown below:

ON THE TITLE PAGE:
   In item "(54)," the first line "EXPOSURE APPARATUS ANTI-VIBRATION" should read -- EXPOSURE APPARATUS, ANTI-VIBRATION --.

IN THE DRAWINGS:
   In "Sheet 21 of 25," in "FIG. 21," in the box labeled "S72," in the last line, "SYSTEM" should read -- SYSTEMS) --.

COLUMN 1:
   Line 1, "EXPOSURE APPARATUS ANTI-VIBRATION" should read -- EXPOSURE APPARATUS, ANTI-VIBRATION --.

COLUMN 2:
   Line 33, "periodical" should read -- periodic --.

COLUMN 5:
   Line 51, "signal;" should read -- signal --.

COLUMN 11:
   Line 26, "interance" should read -- inertance --.

COLUMN 16:
   Line 62, "$M\dot{k} + C\dot{k} + KX = F$" should read -- $M\ddot{X} + C\dot{X} + KX = F$ --.

COLUMN 18:
   Line 63, "unit 1201" should read -- unit 1204 --.

COLUMN 20:
   Line 58, "signal Sy" should read -- signal $S_y$ --.
   Line 60, "signal $F_x$" should read -- signal $F_z$ --.

COLUMN 23:
   Line 23, "six-degree-of-freedom" should read -- six-degrees-of-freedom --.
   Line 31, "six-degree-of-freedom" should read -- six-degrees-of-freedom --.
   Line 67, "six-degree-of-freedom" should read -- six-degrees-of-freedom --.

COLUMN 24:
   Line 49, "six-degree-of-freedom" should read -- six-degrees-of-freedom --.

UNITED STATES PATENT AND TRADEMARK OFFICE
CERTIFICATE OF CORRECTION

PATENT NO. : 7,072,777 B1
APPLICATION NO. : 09/333522
DATED : July 4, 2006
INVENTOR(S) : Shinji Wakui et al.

It is certified that error appears in the above-identified patent and that said Letters Patent is hereby corrected as shown below:

COLUMN 27:
　　Line 36, "six-degree-of-" should read -- six-degrees-of- --.

COLUMN 28:
　　Line 26, "$f_y$," should read -- $\theta_y$, --.

COLUMN 31:
　　Line 23, "$S^{12}+a_{11}s^{11+}+a_{10}s^{10}+ \ldots +a_2s^2+a_1s^1+a_0$　　(5)" should read -- $s^{12}+a_{11}s^{11}+a_{10}s^{10}+ \ldots +a_2s^2+a_1s+a_0$　　(5) --.
　　Line 40, "$s^{12}+a'_{11}s^{11+}+a'_{10}s^{10}+ \ldots +a'_2s^2++a'_1s+a'_0$　　(7)" should read -- $s^{12}+a'_{11}s^{11}+a'_{10}s^{10}+ \ldots +a'_2s^2+a'_1s+a'_0$　　(7) --.
　　Line 56, "same.　As in this" should read -- same. --, and the right margin should be closed up.
　　Line 57, "embodiment," should begin a new paragraph and read --As in this embodiment, --.

COLUMN 32:
　　Line 56, "describe" should read -- described --.

COLUMN 33:
　　Line 4, the second occurrence of "$F_{yo}$," should read -- $F_{zo}$, --.

COLUMN 35:
　　Line 53, "servers" should read -- serves --.
　　Line 59, "by P1," should read -- by $P_1$, --.
　　Line 60, "$(s-P_{1)(s-P2)} \ldots (s-P_{12})$　　(13)" should read -- "$(s-P_1)(s-P_2) \ldots (s-P_{12})$　　(13) --.

UNITED STATES PATENT AND TRADEMARK OFFICE
CERTIFICATE OF CORRECTION

PATENT NO. : 7,072,777 B1
APPLICATION NO. : 09/333522
DATED : July 4, 2006
INVENTOR(S) : Shinji Wakui et al.

It is certified that error appears in the above-identified patent and that said Letters Patent is hereby corrected as shown below:

COLUMN 37:
    Line 23, "suffice," should read -- suffices, --.

Signed and Sealed this

Second Day of January, 2007

JON W. DUDAS
*Director of the United States Patent and Trademark Office*